(12) United States Patent
Kawashima

(10) Patent No.: US 6,559,540 B2
(45) Date of Patent: May 6, 2003

(54) FLIP-CHIP SEMICONDUCTOR DEVICE AND METHOD OF FORMING THE SAME

(75) Inventor: Tomohiro Kawashima, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/779,627

(22) Filed: Feb. 9, 2001

(65) Prior Publication Data

US 2001/0023993 A1 Sep. 27, 2001

(30) Foreign Application Priority Data

Feb. 9, 2000 (JP) ........................................ 2000-038071

(51) Int. Cl.[7] .............................................. H01L 23/48
(52) U.S. Cl. ........................ 257/737; 257/758; 257/780
(58) Field of Search ................................ 257/737, 738, 257/758, 759, 780, 781

(56) References Cited

U.S. PATENT DOCUMENTS 6,181,569 B1 * 1/2001 Chakravorty ............... 257/737
6,235,552 B1 * 5/2001 Kwon et al. ................ 438/107
6,324,048 B1 * 11/2001 Liu ........................... 361/306.1
6,362,437 B1 * 3/2002 Arai ........................... 257/738
6,396,145 B1 * 5/2002 Nagai et al. ................. 257/737

* cited by examiner

Primary Examiner—Kevin M. Picardat
(74) Attorney, Agent, or Firm—Young & Thompson

(57) ABSTRACT

The present invention provides a semiconductor device comprising: a semiconductor substrate; at least a pad electrode provided over the semiconductor substrate; a passivation film provided over the semiconductor substrate; an insulative resin stress buffer layer provided over the at least pad electrode and the passivation film, the insulative resin stress buffer layer having at least an opening positioned over at least a part of the at least pad electrode; and at least a land portion provided over the insulative resin stress buffer layer and also electrically connected to the at least pad electrode, and a top surface of the at least land portion being electrically connected to at least a bump which is positioned over the at least land portion, wherein the at least land portion and the passivation film are isolated from each other by the insulative resin stress buffer layer.

47 Claims, 69 Drawing Sheets

FLIP-CHIP SEMICONDUCTOR DEVICE AND METHOD OF FORMING THE SAME

BACKGROUND OF THE INVENTION

The present invention relates to a flip-chip semiconductor device and a method of forming the same, and more particularly to a repairable flip-chip semiconductor device which allows that a non-defective flip-chip-mounted semiconductor device is once removed from a defective multilayer circuit board for repairing the non-defective flip-chip-mounted semiconductor device to a new non-defective multilayer circuit board for realizing a possible low manufacturing cost and a method of forming the same.

The conventional flip-chip semiconductor device comprises a semiconductor chip, wherein an array of external electrodes is provided either on a peripheral region of the semiconductor chip or an active region of the semiconductor chip, and further bumps are formed on the external electrodes. The bumps may, for example, comprise either solder bumps, Au bumps and Sn—Ag alloy bumps. The semiconductor device is flip-chip-bonded on a multilayer circuit board having electrode pads having the same patterns as the bumps of the semiconductor device. If the bumps comprise the solder bumps, then an infrared ray re-flow process using a flux is usually used for flip-chip-mounting the semiconductor device onto the multilayer circuit board. After the semiconductor device has been flip-chip-mounted onto the multilayer circuit board, then there is raised a serious problem with a temperature cyclic characteristic in the mounting reliability due to mismatch in linear expansion coefficient between the semiconductor device and the multilayer circuit board.

In order to improve the temperature cyclic characteristic, it had been proposed to make an expansion coefficient of the multilayer circuit board close to an expansion coefficient of the semiconductor device. Namely, it had been proposed to minimize the mismatch in linear expansion coefficient between the semiconductor device and the multilayer circuit board for improvement of the mounting reliability. For this purpose, ceramic based materials are used for the multilayer circuit board. Since, those ceramic based materials are, however, expensive, the applications of the conventional flip-chip semiconductor devices have been limited to super computers and large scale computers.

In recent years, inexpensive and large linear expansion coefficient organic materials have been used for the multilayer circuit board in place of the above expensive ceramic based materials, wherein an inter-space between the semiconductor device and the organic material multilayer circuit board is filled with an under-fill resin. The provision of the under-fill resin into the inter-space between the semiconductor device and the organic material multilayer circuit board results in relaxation or dispersion of a shearing stress applied to the bumps between the semiconductor device and the organic material multilayer circuit board, thereby improving the mounting reliability. The provision of the under-fill resin into the inter-space between the semiconductor device and the organic material multilayer circuit board allows the use of the inexpensive organic material multilayer circuit board. The use of the under-fill resin may raise the following problems. If any voids are present in the under-fill resin or if the under-fill resin has inferior adhesiveness with the interface of the semiconductor device or with the interface of the organic material multilayer circuit board. In a porosity re-flow process of the product, peeling may appear on the under-fill resin interfaces to the semiconductor device and to the organic material multilayer circuit board, whereby the yield is dropped. Indiscriminately, it can not be said that the provision of the under-fill resin into the inter-space between the semiconductor device and the organic material multilayer circuit board realizes the low manufacturing cost.

The flip-chip semiconductor chip is expensive. If the above temperature cyclic characteristics have been improved, then no problem may be raised. If, however, any defective appear on the other part than the semiconductor chip after the semiconductor chip has been mounted on the multilayer circuit board, then it is necessary to repair the non-defective semiconductor chip to a new non-defective multilayer circuit board instead of the defective multilayer circuit board. Once the under-fill resin is provided between the inter-space between the semiconductor chip and the multilayer circuit board, it is difficult to repair the non-defective semiconductor chip to a new non-defective multilayer circuit board. In this case, not only the defective semiconductor device but also the non-defective multilayer circuit board could not be used.

By contrast, if the ceramic-based material is used for the multilayer circuit board wherein the linear expansion coefficient of the ceramic-based material is optimized, then it is unnecessary to provide the under-fill resin into the inter-space between the semiconductor device and the multilayer circuit board. It is relatively easy to repair the non-defective semiconductor chip to a new non-defective multilayer circuit board. FIGS. 1A through 1C are schematic side views illustrative of sequential repair processes for removing the non-defective semiconductor chip from the defective multilayer circuit board. With reference to FIG. 1A, a non-defective semiconductor chip 101 with solder bumps 102 are flip-chip-mounted on a defective multilayer circuit board 110. With reference to FIG. 1B, an adsorbing and heating tool 120 is made into contact with an opposite surface of the non-defective semiconductor chip 101 to the surface having the solder bumps 102 and facing to the defective multilayer circuit board 110. The adsorbing and heating tool 120 has heaters 121 for heating the non-defective semiconductor chip 101 with the solder bumps 102. The adsorbing and heating tool 120 is capable of vacuum adsorption with the non-defective semiconductor chip 101 and also the heaters 121 generate heats to be transmitted through the non-defective semiconductor chip 101 to the solder bumps 102, whereby bonding portions of the solder bumps 102 to electrode pads of the defective multilayer circuit board 110 are melt. In this state, the adsorbing and heating tool 120 performing the vacuum adsorption with the non-defective semiconductor chip 101 is moved upwardly to remove the non-defective semiconductor chip 101 from the defective multilayer circuit board 110. With reference to FIG. 1C, the non-defective semiconductor chip 101 is peeled from the defective multilayer circuit board 110 for subsequent repairing the non-defective semiconductor chip 101 to a new non-defective multilayer circuit board.

The non-defective semiconductor chip 101 is peeled from the defective multilayer circuit board 110 by the mechanical force due to the vacuum adsorption after the solder bumps 102 have sufficiently be heated by the heat conduction from the heaters 121 through the non-defective semiconductor chip 101. The mechanical force may provide a certain mechanical damage to the solder bumps 102 on the non-defective semiconductor chip 101 and also provide a damage to barrier metal junction portions between the solder bumps 102 and the non-defective semiconductor chip 101.

Further, the mechanical force may provide a certain mechanical damage to a passivation film of a polyimide based organic material or silicon oxide which protects the active regions of the non-defective semiconductor chip 101 as well as provide a damage to the non-defective semiconductor chip 101, whereby the non-defective semiconductor chip 101 becomes defective.

In Japanese laid-open patent publication No. 10-135270, it is disclosed to solve the above problem. After a passivation film is formed on a surface of a semiconductor region on which solder bumps are intended to be formed, an insulation film is further formed on the passivation film. External electrodes are formed on the insulating films over the passivation film. The solder bumps are then formed on the external electrodes. A further protective layer of an insulating resin is formed which covers the entire regions except for the solder bumps. The insulating layer interposed between the solder bumps and the external electrodes and the semiconductor chip relaxes the mechanical force to be applied to the semiconductor chip for peeling the semiconductor chip from the multilayer circuit board. Namely, the interposed insulating layer relaxes the mechanical stress to the semiconductor chip, thereby reducing the damages to the passivation film and the semiconductor chip. This conventional technique is also disclosed in Japanese laid-open patent publication No. 11-121518.

As described above, the insulating resin protective layer for protecting the external electrodes is formed over the interposed insulating layer which relaxes the mechanical stress to the semiconductor chip. The interposed insulating layer is made of a material having a flexibility for relaxing the mechanical stress to the semiconductor chip, wherein it is possible that the material having the flexibility suitable for the interposed insulating layer is different in thermal expansion coefficient from the insulating resin protective layer formed over the interposed insulating layer. The insulating resin protective layer is formed by a coating method to obtain a high adhesion with the interposed insulating layer. A temperature history causes a thermal stress to an interface between the insulating resin protective layer and the interposed insulating layer. This thermal stress causes bending of the semiconductor chip or the semiconductor wafer and also causes cracks in the insulating resin protective layer. After the insulating resin protective layer has been formed by the coating method, it is necessary to selectively etch the insulating resin protective layer to form openings in the insulating resin protective layer for subsequent formations of solder bumps in the openings. This makes the manufacturing processes, whereby the manufacturing cost is increased. Whereas it is preferable that vertical cross sectioned shapes of the openings are tapered to correspond to the spherical shape of the solder bumps, it is, actually however, that the selective etching process forms cylindrically shaped openings, wherein the vertical cross sectioned shapes of the openings are rectangle.

In the above circumstances, it had been required to develop a novel flip-chip semiconductor device and method of forming the same free from the above problem.

SUMMARY OF THE INVENTION

Accordingly, it is an object of the present invention to provide a novel flip-chip semiconductor device free from the above problems.

It is a further object of the present invention to provide a novel repairable flip-chip semiconductor device which allows that a non-defective flip-chip-mounted semiconductor device is once removed from a defective multilayer circuit board for repairing the non-defective flip-chip-mounted semiconductor device to a new non-defective multilayer circuit board for realizing a possible low manufacturing cost.

It is a still further object of the present invention to provide a novel method of forming a novel flip-chip semiconductor device free from the above problems.

It is yet a further object of the present invention to provide a novel method of forming a novel repairable flip-chip semiconductor device which allows that a non-defective flip-chip-mounted semiconductor device is once removed from a defective multilayer circuit board for repairing the non-defective flip-chip-mounted semiconductor device to a new non-defective multilayer circuit board for realizing a possible low manufacturing cost.

The present invention provides a semiconductor device comprising: a semiconductor substrate; at least a pad electrode provided over the semiconductor substrate; a passivation film provided over the semiconductor substrate; an insulative resin stress buffer layer provided over the at least pad electrode and the passivation film, the insulative resin stress buffer layer having at least an opening positioned over at least a part of the at least pad electrode; and at least a land portion provided over the insulative resin stress buffer layer and also electrically connected to the at least pad electrode, and a top surface of the at least land portion being electrically connected to at least a bump which is positioned over the at least land portion, wherein the at least land portion and the passivation film are isolated from each other by the insulative resin stress buffer layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

First Embodiment

Figure 1A:
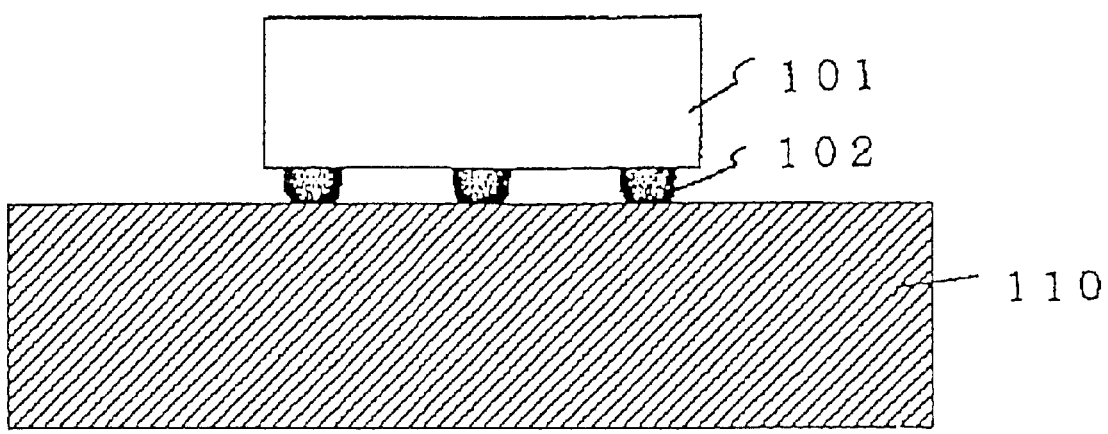
FIGS. 1A through 1C are schematic side views illustrative of sequential repair processes for removing the non-defective semiconductor chip from the defective multilayer circuit board.
Figure 1B:
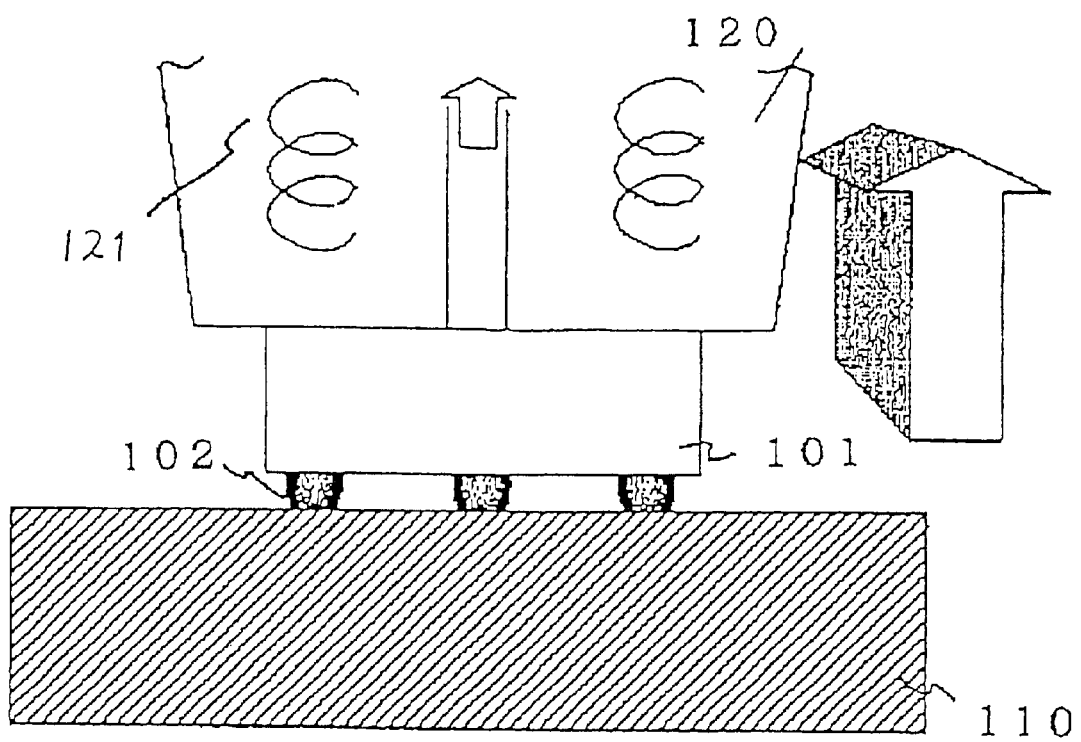
Figure 1C:
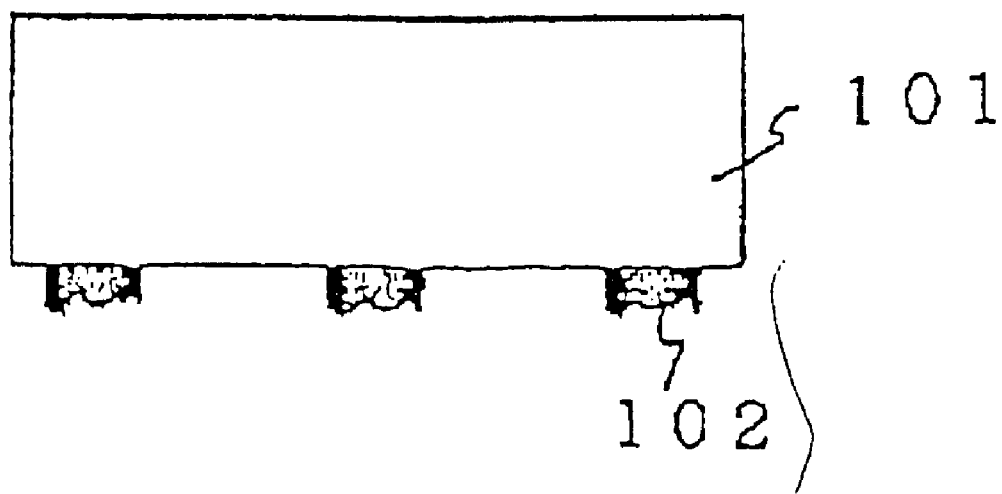

The first present invention provides a semiconductor device comprising: a semiconductor substrate; at least a pad electrode provided over the semiconductor substrate; a passivation film provided over the semiconductor substrate; an insulative resin stress buffer layer provided over the at least pad electrode and the passivation film, the insulative resin stress buffer layer having at least an opening positioned over at least a part of the at least pad electrode; and at least a land portion provided over the insulative resin stress buffer layer and also electrically connected to the at least pad electrode, and a top surface of the at least land portion being electrically connected to at least a bump which is positioned over the at least land portion, wherein the at least land portion and the passivation film are isolated from each other by the insulative resin stress buffer layer.

It is preferable to further comprise: an adhesive layer provided over the land portion and the insulative resin stress buffer layer; an insulating sheet provided over the adhesive layer; at least a through hole penetrating the insulating sheet and the adhesive layer, and the at least through hole being positioned over the at least land portion; at least a post electrode in the at least through hole, the at least post electrode having a bottom portion in contact with the top surface of the at least land portion and a top portion in contact with the at least bump, so that the at least land portion is electrically connected through the at least post electrode to the bump.

It is moreover preferable to further comprise: an adhesive metal layer interposed between the at least pad electrode and the at least land portion.

It is further more preferable that the adhesive metal layer comprises a metal having a high adhesiveness with the at least pad electrode and a gentle metal inter-diffusion as well as a high adhesiveness with the insulative resin stress buffer layer.

It is also preferable to further comprise: an inter-level insulative resin layer provided over the land portion and the insulative resin stress buffer layer; at least a first through hole penetrating the inter-level insulative resin layer, and the at least first through hole being positioned over the at least land portion; at least a post contact in the at least first through hole, the at least post contact having a bottom portion in contact with the top surface of the at least land portion and a top portion which is equal to or slightly higher in level than a top surface of the inter-level insulative resin layer; an adhesive layer provided over the inter-level insulative resin layer; an insulating sheet provided over the adhesive layer; at least a second through hole penetrating the insulating sheet and the adhesive layer, and the at least second through hole being positioned over the at least post contact; and at least a post electrode in the at least through hole, the at least post electrode having a bottom portion in contact with a top of the at least post contact and a top portion in contact with the at least bump, so that the at least land portion is electrically connected through the at least post electrode and the at least post contact to the bump.

It is also preferable to further comprise: an adhesive metal layer interposed between the at least pad electrode and the at least land portion.

It is moreover preferable that the adhesive metal layer comprises a metal having a high adhesiveness with the at least pad electrode and a gentle metal inter-diffusion as well as a high adhesiveness with the insulative resin stress buffer layer.

It is also preferable to further comprise: an adhesive layer provided over the land portion and the insulative resin stress buffer layer; and an insulating sheet provided over the adhesive layer, wherein the at least bump is partially buried in the adhesive layer and the insulating sheet, and a bottom of the at least bump is in contact directly with the top surface of the land portion, and the bump is tightly supported by the adhesive layer and secured to the land portion.

It is moreover preferable to further comprise: an adhesive metal layer interposed between the at least pad electrode and the at least land portion.

It is also preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The second present invention provides a semiconductor device comprising: a semiconductor substrate; at least a pad electrode provided over the semiconductor substrate; a passivation film provided over the semiconductor substrate; an insulative resin stress buffer layer provided over the at least pad electrode and the passivation film, the insulative resin stress buffer layer having at least an opening positioned over at least a part of the at least pad electrode; at least a land portion provided over the insulative resin stress buffer layer and also electrically connected to the at least pad electrode, and a top surface of the at least land portion being electrically connected to at least a bump which is positioned over the at least land portion; an adhesive layer provided over the land portion and the insulative resin stress buffer layer; an insulating sheet provided over the adhesive layer; at least a through hole penetrating the insulating sheet and the adhesive layer, and the at least through hole being positioned over the at least land portion; and at least a post electrode in the at least through hole, the at least post electrode having a bottom portion in contact with the top surface of the at least land portion and a top portion in contact with the at least bump, so that the at least land portion is electrically connected through the at least post electrode to the bump, wherein the at least land portion and the passivation film are isolated from each other by the insulative resin stress buffer layer.

It is also preferable to further comprise: an adhesive metal layer interposed between the at least pad electrode and the at least land portion.

It is also preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The third present invention provides a semiconductor device comprising: a semiconductor substrate; at least a pad electrode provided over the semiconductor substrate; a passivation film provided over the semiconductor substrate; an insulative resin stress buffer layer provided over the at least pad electrode and the passivation film, the insulative resin stress buffer layer having at least an opening positioned over at least a part of the at least pad electrode; at least a land portion provided over the insulative resin stress buffer layer and also electrically connected to the at least pad electrode, and a top surface of the at least land portion being electrically connected to at least a bump which is positioned over the at least land portion; an inter-level insulative resin layer provided over the land portion and the insulative resin stress buffer layer; at least a first through hole penetrating the inter-level insulative resin layer, and the at least first through hole being positioned over the at least land portion; at least a post contact in the at least first through hole, the at least post contact having a bottom portion in contact with the top surface of the at least land portion and a top portion which is equal to or slightly higher in level than a top surface of the inter-level insulative resin layer; an adhesive layer provided over the inter-level insulative resin layer; an insulating sheet provided over the adhesive layer; at least a second through hole penetrating the insulating sheet and the adhesive layer, and the at least second through hole being positioned over the at least post contact; and at least a post electrode in the at least through hole, the at least post electrode having a bottom portion in contact with a top of the at least post contact and a top portion in contact with the at least bump, so that the at least land portion is electrically connected through the at least post electrode and the at least post contact to the bump, wherein the at least land portion and the passivation film are isolated from each other by the insulative resin stress buffer layer.

It is preferable to further comprise: an adhesive metal layer interposed between the at least pad electrode and the at least land portion.

It is also preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The fourth present invention provides a semiconductor device comprising: a semiconductor substrate; at least a pad electrode provided over the semiconductor substrate; a passivation film provided over the semiconductor substrate; an insulative resin stress buffer layer provided over the at least pad electrode and the passivation film, the insulative resin stress buffer layer having at least an opening positioned over at least a part of the at least pad electrode; at least a land portion provided over the insulative resin stress buffer layer and also electrically connected to the at least pad electrode, and a top surface of the at least land portion being electrically connected to at least a bump which is positioned over the at least land portion; an adhesive layer provided over the land portion and the insulative resin stress buffer layer; and an insulating sheet provided over the adhesive layer, wherein the at least land portion and the passivation film are isolated from each other by the insulative resin stress buffer layer, and wherein the at least bump is partially buried in the adhesive layer and the insulating sheet, and a bottom of the at least bump is in contact directly with the top surface of the land portion, and the bump is tightly supported by the adhesive layer and secured to the land portion.

It is also preferable to further comprise: an adhesive metal layer interposed between the at least pad electrode and the at least land portion.

It is also preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The fifth present invention provides a method of forming a semiconductor device comprising the steps of: forming a passivation film and at least a pad electrode over a semiconductor substrate; forming an insulative resin stress buffer layer over the at least pad electrode and the passivation film; forming at least an opening in the insulative resin stress buffer layer, the at least opening being positioned over at least a part of the at least pad electrode; and forming at least a land portion over the insulative resin stress buffer layer, wherein the at least land portion and the passivation film are isolated from each other by the insulative resin stress buffer layer.

It is also preferable to further comprise the steps of: forming an adhesive layer over the land portion and the insulative resin stress buffer layer; forming an insulating sheet over the adhesive layer; forming at least a through hole penetrating the insulating sheet and the adhesive layer, and the at least through hole being positioned over the at least land portion and forming at least a post electrode in the at least through hole, the at least post electrode having a bottom portion in contact with the top surface of the at least land portion and a top portion in contact with the at least bump, so that the at least land portion is electrically connected through the at least post electrode to the bump.

It is further more preferable to further comprise the step of forming an adhesive metal layer over the at least pad electrode and the insulative resin stress buffer layer before the at least land portion is formed.

It is still further preferable that the adhesive metal layer comprises a metal having a high adhesiveness with the at least pad electrode and a gentle metal inter-diffusion as well as a high adhesiveness with the insulative resin stress buffer layer.

It is also preferable to further comprise the steps of: forming an inter-level insulative resin layer over the land portion and the insulative resin stress buffer layer; forming at least a first through hole penetrating the inter-level insulative resin layer, and the at least first through hole being positioned over the at least land portion; forming at least a post contact in the at least first through hole, the at least post contact having a bottom portion in contact with the top surface of the at least land portion and a top portion which is equal to or slightly higher in level than a top surface of the inter-level insulative resin layer; forming an adhesive layer over the inter-level insulative resin layer; forming an insulating sheet over the adhesive layer; forming at least a second through hole penetrating the insulating sheet and the adhesive layer, and the at least second through hole being positioned over the at least post contact; and forming at least a post electrode in the at least through hole, the at least post electrode having a bottom portion in contact with a top of the at least post contact and a top portion in contact with the at least bump, so that the at least land portion is electrically connected through the at least post electrode and the at least post contact to the bump.

It is also preferable to further comprise the step of: forming an adhesive metal layer over the at least pad electrode and the insulative resin stress buffer layer before the at least land portion is formed.

It is furthermore preferable that the adhesive metal layer comprises a metal having a high adhesiveness with the at least pad electrode and a gentle metal inter-diffusion as well as a high adhesiveness with the insulative resin stress buffer layer.

It is also preferable to further comprise the steps of: forming an adhesive layer over the land portion and the insulative resin stress buffer layer; and forming an insulating sheet over the adhesive layer, wherein the at least bump is partially buried in the adhesive layer and the insulating sheet, and a bottom of the at least bump is in contact directly with the top surface of the land portion, and the bump is tightly supported by the adhesive layer and secured to the land portion.

It is moreover preferable to further comprise the step of: forming an adhesive metal layer over the at least pad electrode and the insulative resin stress buffer layer before the at least land portion is formed.

It is further more preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The sixth present invention provides a method of forming a semiconductor device comprising the steps of: forming a passivation film and at least a pad electrode over a semiconductor substrate; forming an insulative resin stress buffer layer over the at least pad electrode and the passivation film, the insulative resin stress buffer layer having at least an opening positioned over at least a part of the at least pad electrode forming at least a land portion over the insulative resin stress buffer layer and also electrically connected to the at least pad electrode, and a top surface of the at least land portion being electrically connected to at least a bump which is positioned over the at least land portion; forming an adhesive layer over the land portion and the insulative resin stress buffer layer; forming an insulating sheet over the adhesive layer; forming at least a through hole penetrating the insulating sheet and the adhesive layer, and the at least through hole being positioned over the at least land portion and forming at least a post electrode in the at least through hole, the at least post electrode having a bottom portion in contact with the top surface of the at least land portion and a top portion in contact with the at least bump, so that the at least land portion is electrically connected through the at least post electrode to the bump, wherein the at least land portion and the passivation film are isolated from each other by the insulative resin stress buffer layer.

It is also preferable to further comprise the step of: forming an adhesive metal layer over the at least pad electrode and the insulative resin stress buffer layer before the at least land portion is formed.

It is still further preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The seventh present invention provides a method of forming a semiconductor device comprising the steps of: forming a passivation film and at least a pad electrode over a semiconductor substrate; forming an insulative resin stress buffer layer over the at least pad electrode and the passivation film, the insulative resin stress buffer layer having at least an opening positioned over at least a part of the at least pad electrode; forming at least a land portion over the insulative resin stress buffer layer and also electrically connected to the at least pad electrode, and a top surface of the at least land portion being electrically connected to at least a bump which is positioned over the at least land portion; forming an inter-level insulative resin layer over the land portion and the insulative resin stress buffer layer; forming at least a first through hole penetrating the inter-level insulative resin layer, and the at least first through hole being positioned over the at least land portion; forming at least a post contact in the at least first through hole, the at least post contact having a bottom portion in contact with the top surface of the at least land portion and a top portion which is equal to or slightly higher in level than a top surface of the inter-level insulative resin layer; forming an adhesive layer over the inter-level insulative resin layer; forming an insulating sheet over the adhesive layer; forming at least a second through hole penetrating the insulating sheet and the adhesive layer, and the at least second through hole being positioned over the at least post contact; and forming at least a post electrode in the at least through hole, the at least post electrode having a bottom portion in contact with a top of the at least post contact and a top portion in contact with the at least bump, so that the at least land portion is electrically connected through the at least post electrode and the at least post contact to the bump, wherein the at least land portion and the passivation film are isolated from each other by the insulative resin stress buffer layer.

It is also preferable to further comprise the step of: forming an adhesive metal layer over the at least pad electrode and the insulative resin stress buffer layer before the at least land portion is formed.

It is also preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

The eighth present invention provides a method of forming a semiconductor device comprising the steps of: forming a passivation film and at least a pad electrode over a semiconductor substrate; forming an insulative resin stress buffer layer over the at least pad electrode and the passivation film, the insulative resin stress buffer layer having at least an opening positioned over at least a part of the at least pad electrode; forming at least a land portion over the insulative resin stress buffer layer and also electrically connected to the at least pad electrode, and a top surface of the at least land portion being electrically connected to at least a bump which is positioned over the at least land portion; forming an adhesive layer over the land portion and the insulative resin stress buffer layer; and forming an insulating sheet over the adhesive layer, wherein the at least land portion and the passivation film are isolated from each other by the insulative resin stress buffer layer, and wherein the at least bump is partially buried in the adhesive layer and the insulating sheet, and a bottom of the at least bump is in contact directly with the top surface of the land portion, and the bump is tightly supported by the adhesive layer and secured to the land portion.

It is also preferable to further comprise the step of : forming an adhesive metal layer over the at least pad electrode and the insulative resin stress buffer layer before the at least land portion is formed.

It is also preferable that the adhesive metal layer comprises a metal having a high adhesiveness with the at least pad electrode and a gentle metal inter-diffusion as well as a high adhesiveness with the insulative resin stress buffer layer.

It is also preferable that the adhesive metal layer comprises a titanium-based alloy.

It is also preferable that the adhesive metal layer comprises chromium.

It is also preferable that the at least land portion comprises a part of a re-wiring layer extending over the insulative resin stress buffer layer.

It is also preferable that the insulative resin stress buffer layer comprises an organic resin material having a decomposition temperature of not less than 200° C.

It is also preferable that the insulative resin stress buffer layer includes a thermosetting resin composition.

It is also preferable that the insulative resin stress buffer layer comprises a photo-sensitive resin composition.

It is also preferable that the at least bump comprises a spherical solder bump.

Preferred Embodiment

First Embodiments

Figure 2:
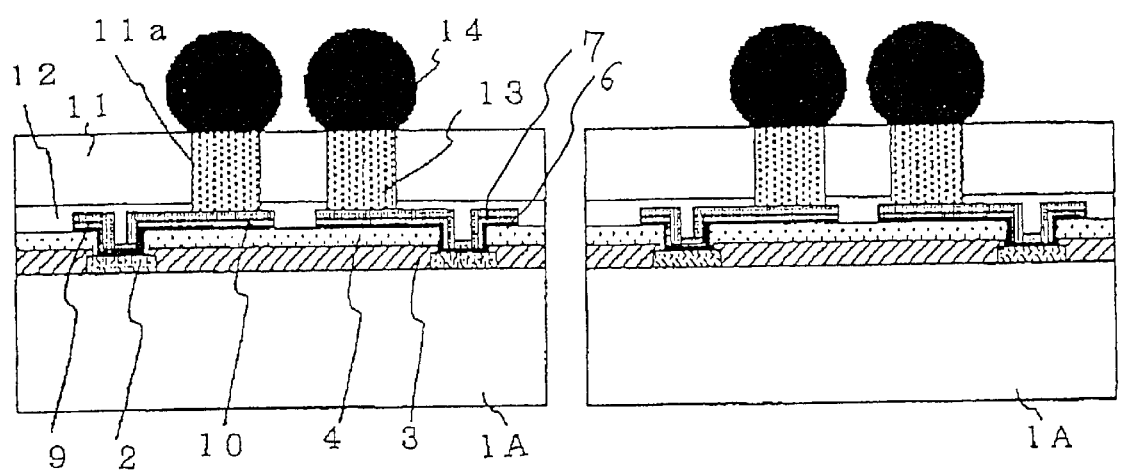
FIG. 2 is a fragmentary cross sectional elevation view illustrative of a first novel repairable flip-chip semiconductor device with solder bumps in a first embodiment in accordance with the present invention.

A first embodiment according to the present invention will be described in detail with reference to the drawings. FIG. 2 is a fragmentary cross sectional elevation view illustrative of a first novel repairable flip-chip semiconductor device with solder bumps in a first embodiment in accordance with the present invention. Pad electrodes 2 are selectively provided on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further provided on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin. An insulating resin coating layer 4 is entirely provided which extends over the pad electrodes 2 and the passivation film 3. The insulating resin coating layer 4 may comprise an organic material such as a polyimide resin, wherein openings 4a are provided in the insulating resin coating layer 4. The openings 4a are positioned over the pad electrodes 2, so that the pad electrodes 2 are shown through the openings 4a. A pad electrode adhesive metal layer 6 serving as a base metal thin layer is selectively provided, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. A plated-feeding metal layer 7 is also selectively provided on the surface of the pad electrode adhesive metal layer 6. The plated-feeding metal layer 7 has a low electric resistance characteristic for post-serving as a plated-feeding layer. The plated-feeding metal layer 7 may comprise a metal layer such as a copper layer. A re-wiring layer 9 is selectively provided on the plated-feeding metal layer 7, wherein a part of the re-wiring layer 9 serves as an external terminal formation land portion 10.

An insulating sheet 11 is provided over the semiconductor wafer 1 via an adhesive layer 12, wherein the insulating sheet 11 and the adhesive layer 12 have through holes 11a having the same pattern as the external terminal land portions 10 of the re-wiring layer 9. Namely, the adhesive layer 12 extends over the re-wiring layer 9, and the insulating resin coating layer 4, while the through holes 11a are positioned over the external terminal land portions 10 of the re-wiring layer 9. The through holes 11a are aligned to the external terminal land portions 10 of the re-wiring layer 9. Post-electrodes 13 are provided in the through holes 11a, wherein the bottoms of the post-electrodes 13 are in contact with the external terminal land portions 10 of the re-wiring layer 9. Spherical solder bumps 14 are provided over the post-electrodes 13, so that the spherical solder bumps 14 are in contact with the top surfaces of the post-electrodes 13.

Figure 3A:
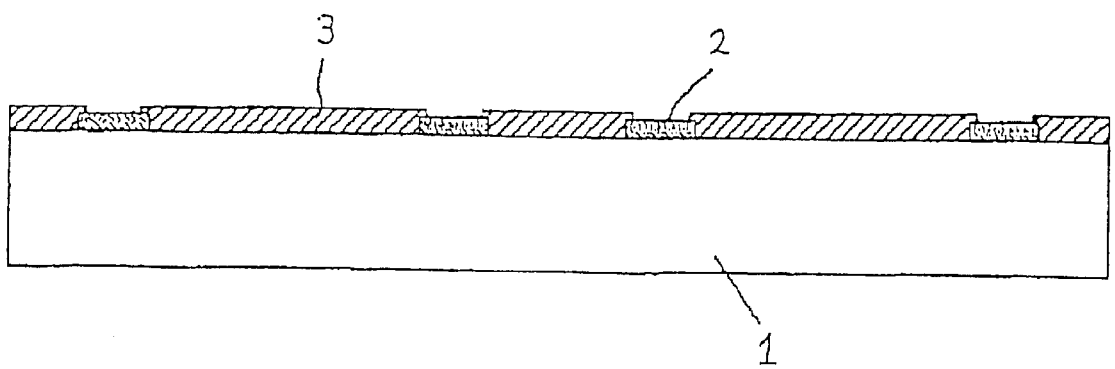
FIGS. 3A through 3O are fragmentary cross sectional elevation views illustrative of first novel repairable flip-chip semiconductor devices with solder bumps in sequential steps involved in a first novel fabrication method in a first embodiment in accordance with the present invention.
Figure 3B:
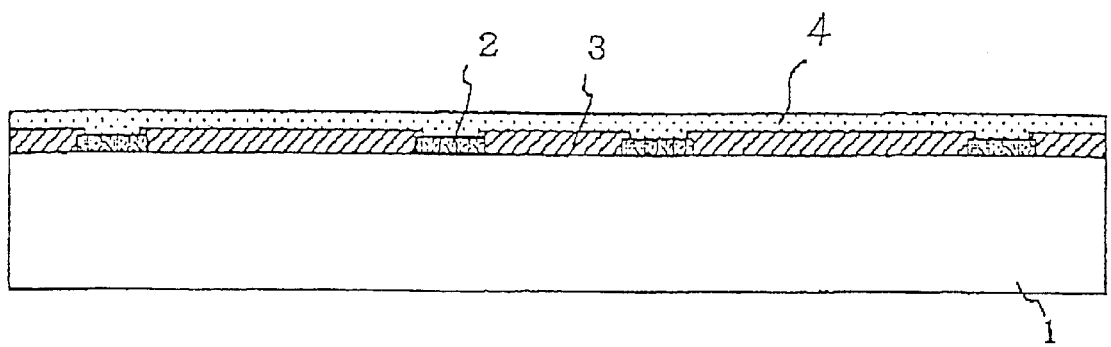
Figure 3C:
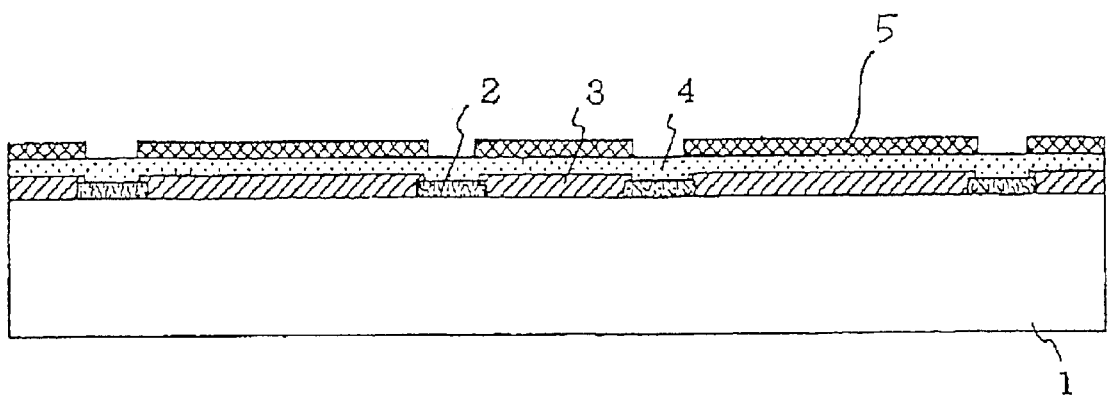
Figure 3D:
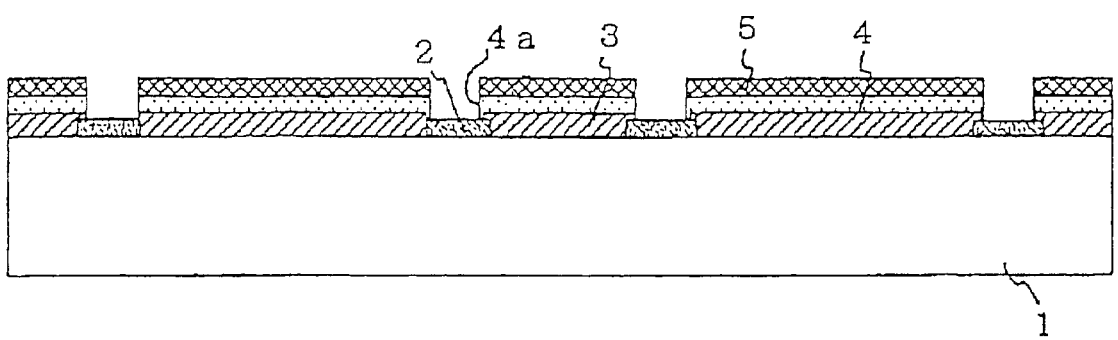
Figure 3E:
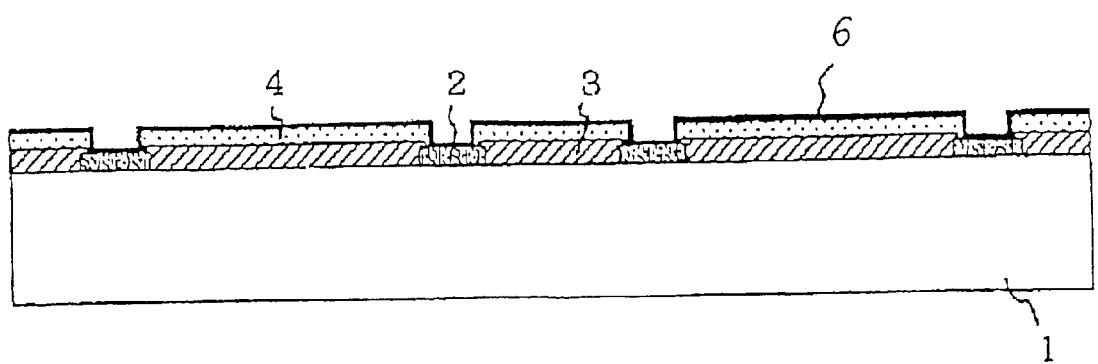
Figure 3F:
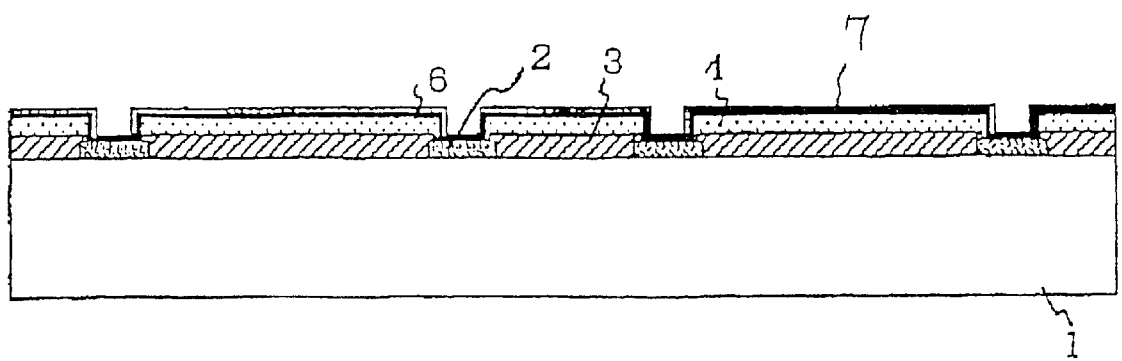
Figure 3G:
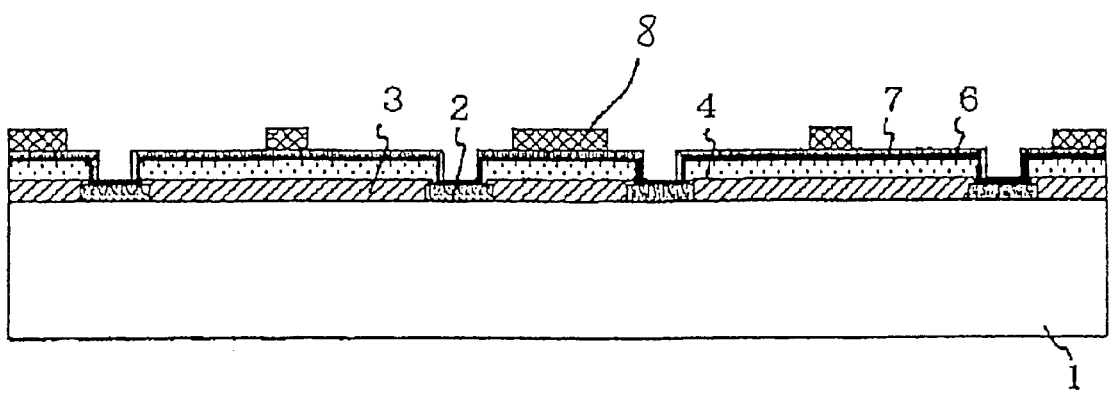
Figure 3H:
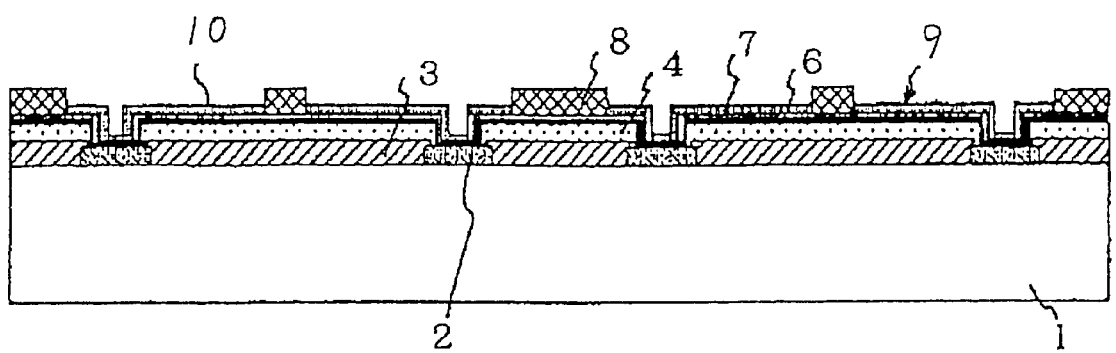
Figure 3I:
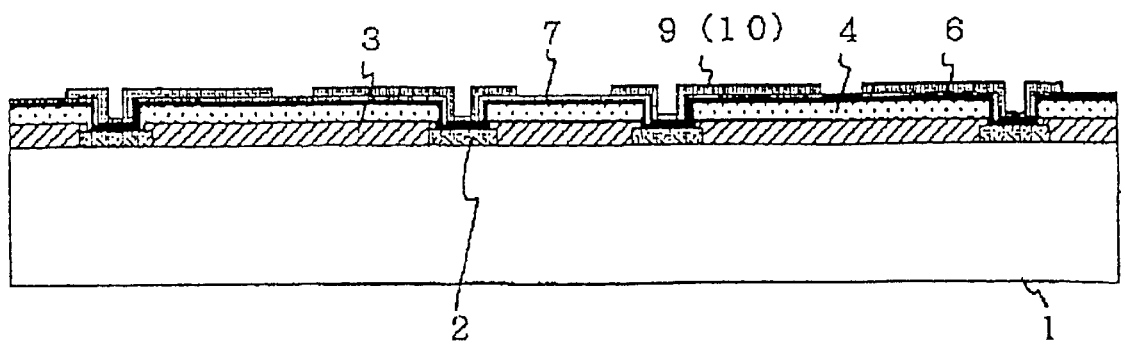
Figure 3J:
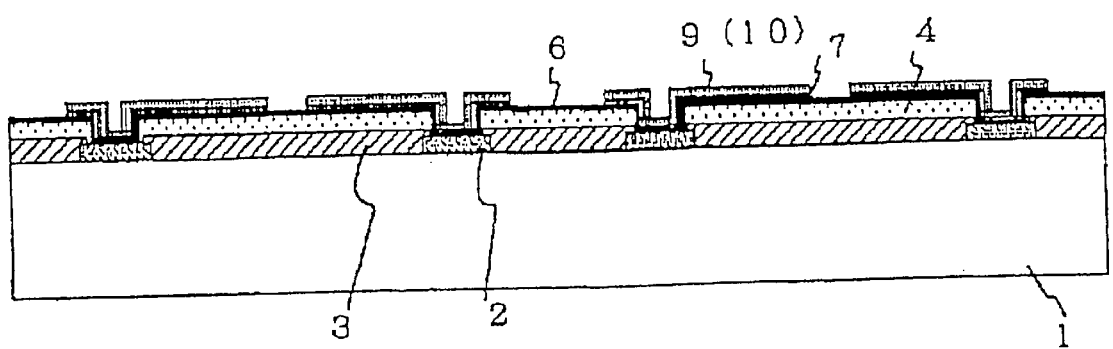
Figure 3K:
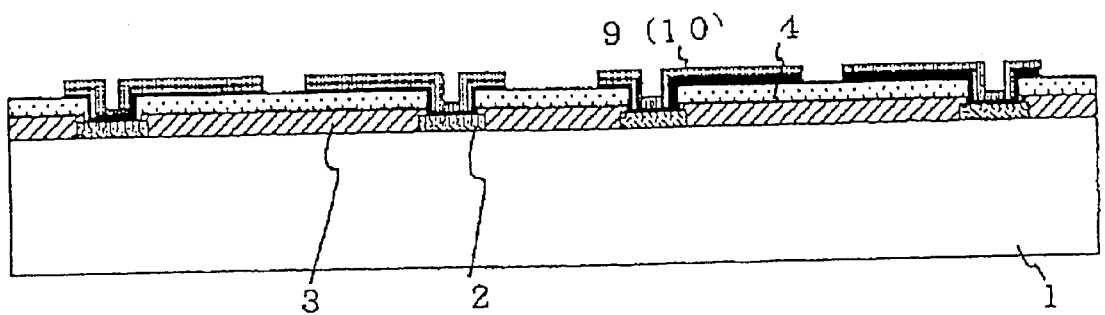
Figure 3L:
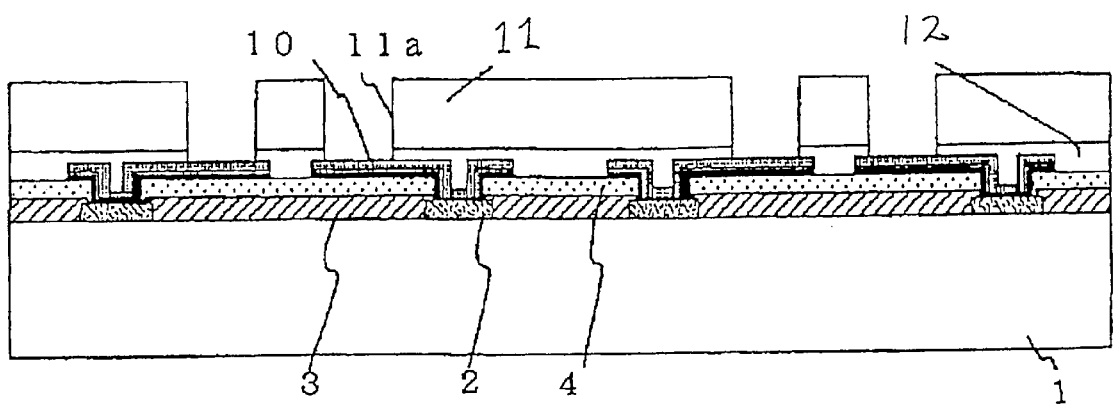
Figure 3M:
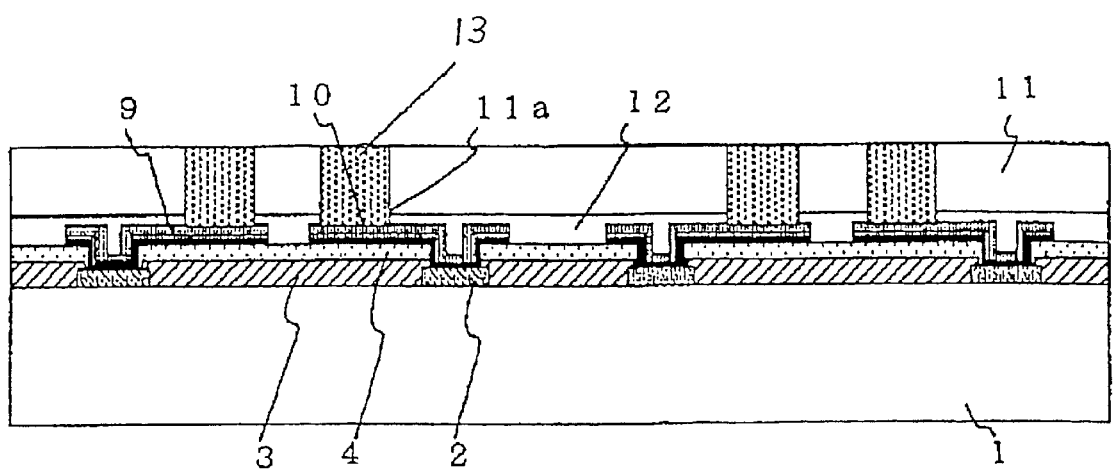
Figure 3N:
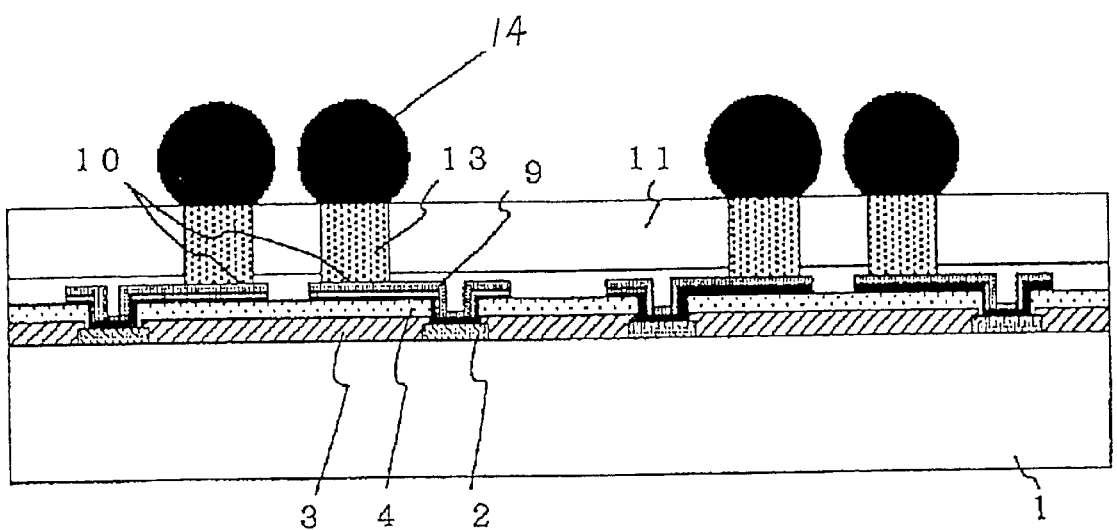
Figure 3O:
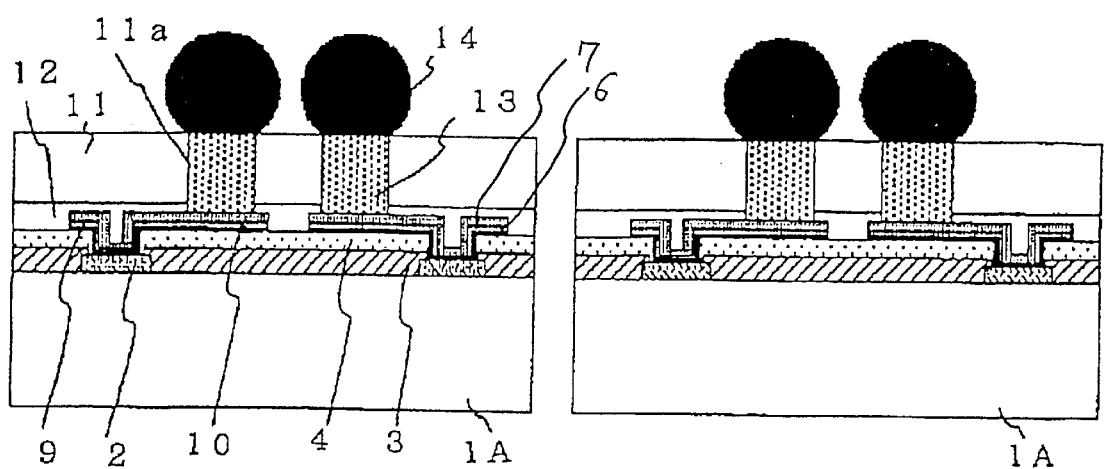

FIGS. 3A through 3O are fragmentary cross sectional elevation views illustrative of first novel repairable flip-chip semiconductor devices with solder bumps in sequential steps involved in a first novel fabrication method in a first embodiment in accordance with the present invention.

With reference to FIG. 3A, pad electrodes 2 are selectively formed on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further formed on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin.

With reference to FIG. 3B, an insulating resin coating layer 4 is entirely formed which extends over the pad electrodes 2 and the passivation film 3. The insulating resin coating layer 4 may comprise an organic material such as a polyimide resin, wherein the insulating resin for the insulating resin coating layer 4 has a thermal decomposition temperature of not less than 200° C. It is possible that the insulating resin for the insulating resin coating layer 4 is blended with a thermosetting resin material. In this case, a heat treatment is carried out at such a temperature as to cause a crosslinking reaction of the resin components or obtaining desired properties of the insulating resin coating layer 4.

With reference to FIG. 3C, a photo-resist film is entirely applied on a top surface of the insulating resin coating layer 4. The photo-resist film is then subjected to an exposure and subsequent development to form a photo-resist pattern 5 over the top surface of the insulating resin coating layer 4.

With reference to FIG. 3D, the photo-resist pattern 5 is used as a mask to carry out an anisotropic etching to the insulating resin coating layer 4, whereby openings 4a are formed in the insulating resin coating layer 4. The openings 4a are positioned over the pad electrodes 2, so that the pad electrodes 2 are shown through the openings 4a. The used photo-resist pattern 5 is then removed. It is alternatively possible that the insulating resin coating layer 4 may comprise a photosensitive resin material. In this case, it is unnecessary to form the photo-resist pattern, and it is possible that the photosensitive resin coating layer is subjected to an exposure and a subsequent development for patterning the photosensitive resin coating layer, whereby the openings 4a are formed in the photosensitive resin coating layer 4 and positioned over the pad electrodes 2, so that the pad electrodes 2 are shown through the openings 4a.

With reference to FIG. 3E, a pad electrode adhesive metal layer 6 serving as a base metal thin layer is entirely deposited by a sputtering method, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. For example, titanium-based alloys or chromium may be available for the pad electrode adhesive metal layer 6. It may optionally be possible that, prior to the formation of the pad electrode adhesive metal layer 6, the surfaces of the pad electrodes 2 are subjected to a plasma surface treatment for cleaning the surfaces of the pad electrodes 2 and also for improving the activity of the surfaces of the pad electrodes 2, so that the pad electrode adhesive metal layer 6 is deposited on the highly clean and highly activated surfaces of the pad electrodes 2.

With reference to FIG. 3F, a plated-feeding metal layer 7 is also entirely deposited by a sputtering method on the surface of the pad electrode adhesive metal layer 6. The plated-feeding metal layer 7 has a low electric resistance characteristic for post-serving as a plated-feeding layer when a re-wiring layer is later formed over the pad electrode adhesive metal layer 6. The plated-feeding metal layer 7 may comprise a metal layer such as a copper layer.

With reference to FIG. 3G, a photo-resist film is entirely applied on the plated-feeding metal layer 7. The photo-resist film is then subjected to an exposure and a subsequent development for patterning the photo-resist film, thereby forming a photo-resist pattern 8, wherein the plated-feeding metal layer 7 is shown and exposed in predetermined re-wiring pattern regions.

With reference to FIG. 3H, a re-wiring layer 9 is formed on the exposed surfaces of the plated-feeding metal layer 7 by a selective electroplating process of copper using the photo-resist pattern 8 as a mask, wherein a part of the re-wiring layer 9 serves as an external terminal formation land portion 10.

With reference to FIG. 3I, the used photo-resist pattern 8 is removed, whereby the re-wiring layer 9 and the plated-feeding metal layer 7 are shown.

With reference to FIG. 3J, a selective wet etching process is carried out by using the re-wiring layer 9 as a mask for selectively etch the plated-feeding metal layer 7, whereby the pad electrode adhesive metal layer 6 are partially shown.

With reference to FIG. 3K, the pad electrode adhesive metal layer 6 is also subjected to the continuous selective wet etching process by using the re-wiring layer 9 as a mask for further selectively etch the pad electrode adhesive metal layer 6, whereby the insulating resin coating layer 4 is partially shown, resulting in that re-wiring patterns, each of which is electrically floated, are thus formed.

With reference to FIG. 3L, an insulating sheet 11 is formed over the semiconductor wafer 1 via an adhesive layer 12, wherein the insulating sheet 11 and the adhesive layer 12 have through holes 11a having the same pattern as the external terminal land portions 10 of the re-wiring layer 9. Namely, the adhesive layer 12 extends over the re-wiring layer 9, and the insulating resin coating layer 4, while the through holes 11a are positioned over the external terminal land portions 10 of the re-wiring layer 9. The through holes 11a are aligned to the external terminal land portions 10 of the re-wiring layer 9, so that the external terminal land portions 10 of the re-wiring layer 9 are shown through the through holes 11a. The alignment of the insulating sheet 11 may easily be carried out by putting an alignment mark on the insulating sheet 11 for alignment of the alignment mark on the insulating sheet 11 to a predetermined position of the semiconductor wafer 1.

With reference to FIG. 3M, a solder paste is filled into the through holes 11a to form post-electrodes 13 in the through holes 11a, wherein the bottoms of the post-electrodes 13 are in contact with the external terminal land portions 10 of the re-wiring layer 9.

With reference to FIG. 3N, spherical solder bumps 14 are formed over the post-electrodes 13, so that the spherical solder bumps 14 are in contact with the top surfaces of the post-electrodes 13. Subsequently, a heat treatment is carried out to unite the spherical solder bumps 14 with the post-electrodes 13. Instead of placing the spherical solder bumps 14 on the top surfaces of the post-electrodes 13, it is also possible that a solder paste is printed on the top surfaces of the post-electrodes 13.

With reference to FIG. 3O, the semiconductor wafer 1 is divided by a dicing blade into plural semiconductor chips 1A, whereby plural flip-chip semiconductor devices are formed.

A non-defective semiconductor chip 1A with the solder bumps 14 as formed in the above described method are then flip-chip-mounted on a multilayer circuit board, wherein the solder bumps 14 are made into contact with pad electrodes of the multilayer circuit board. If the multilayer circuit board is defective, it is necessary to remove the non-defective semiconductor chip 1A from the defective multilayer circuit board, and then repair the non-defective semiconductor chip 1A to a new non-defective multilayer circuit board. For this purpose, an adsorbing and heating tool is made into contact with an opposite surface of the non-defective semiconductor chip 1A to the surface having the solder bumps 14 and facing to the defective multilayer circuit board. The adsorbing and heating tool has heaters for heating the non-defective semiconductor chip 1A with the solder bumps 14. The adsorbing and heating tool is capable of vacuum adsorption with the non-defective semiconductor chip 1A and also the heaters generate heats to be transmitted through the non-defective semiconductor chip 1A to the solder bumps 14, whereby bonding portions of the solder bumps 14 to electrode pads of the defective multilayer circuit board are melt. In this state, the adsorbing and heating tool performing the vacuum adsorption with the non-defective semiconductor chip 1A is moved upwardly to remove the non-defective semiconductor chip 1A from the defective multilayer circuit board. The non-defective semiconductor chip 1A is peeled from the defective multilayer circuit board for subsequent repairing the non-defective semiconductor chip 1A to a new non-defective multilayer circuit board. The non-defective semiconductor chip 1A is peeled from the defective multilayer circuit board by the mechanical force due to the vacuum adsorption after the solder bumps 14 have sufficiently be heated by the heat conduction from the heaters through the non-defective semiconductor chip 1A. In accordance with the present invention, however, the insulating resin coating layer 4 is provided over passivation film 3, wherein the insulating resin coating layer 4 serves as a stress-buffer layer. Further, the external terminal land portions 10 of the re-wiring layer 9 are provided over the insulating resin coating layer 4. The post electrodes 13 are provided over the external terminal land portions 10 of the re-wiring layer 9, and the solder bumps 14 are provided on the post electrodes 13. The heat and the mechanical force applied by the adsorbing and heating tool result in thermal and mechanical stresses appearing on the solder bumps 14. The insulating resin coating layer 4 isolates and protects the passivation film 3 and the active regions of the semiconductor substrate under the passivation film from the thermal and mechanical stresses. Namely, the insulating resin coating layer 4 isolates and protects the semiconductor chip from the thermal and mechanical stresses.

The insulating sheet 11 is provided over the re-wiring layer 9 having the external terminal land portions 10 and also over the pad electrodes 2, so that the insulating sheet 11 serves as a protecting layer for protecting the re-wiring layer 9 having the external terminal land portions 10 and the pad electrodes 2. The insulating sheet 11 is indirectly contact with the re-wiring layer 9 having the external terminal land portions 10. The adhesive layer 12 is interposed between the insulating sheet 11 and the re-wiring layer 9 having the external terminal land portions 10. Namely, the adhesive layer 12 is interposed between the insulating sheet 11 and the insulating resin coating layer 4. The provision of the adhesive layer 12 between the insulating sheet 11 and the insulating resin coating layer 4 results in that the temperature history causes no thermal stress between the insulating sheet 11 and the insulating resin coating layer 4. No thermal stress between the insulating sheet 11 and the insulating resin coating layer 4 causes no bending of the semiconductor chip or the semiconductor wafer nor crack in the insulating sheet 11.

Furthermore, the insulating sheet 11 and the adhesive layer 12 have the through holes 11a which correspond in position to the external terminal land portions 10 of the re-wiring layer 9. For this reason, it is unnecessary to carry out any process for forming openings or through holes in the insulating sheet 11 and the adhesive layer 12 after the insulating sheet 11 and the adhesive layer 12 have been formed over the semiconductor wafer 1. This means the reduction in the number of the necessary manufacturing processes, whereby it is possible to reduce the manufacturing cost. Since the through holes 11a have already been formed in the insulating sheet 11 before the insulating sheet 11 with the through holes 11a are formed over the semiconductor wafer 1, then it is possible to use a laser for forming the through holes 11a in the insulating sheet 11. The laser method is able to form the through holes 11a so that the cross sectional elevation shape of the through holes 11a is tapered, which fits to the spherical shape solder bumps 14.

Second Embodiment

Figure 4:
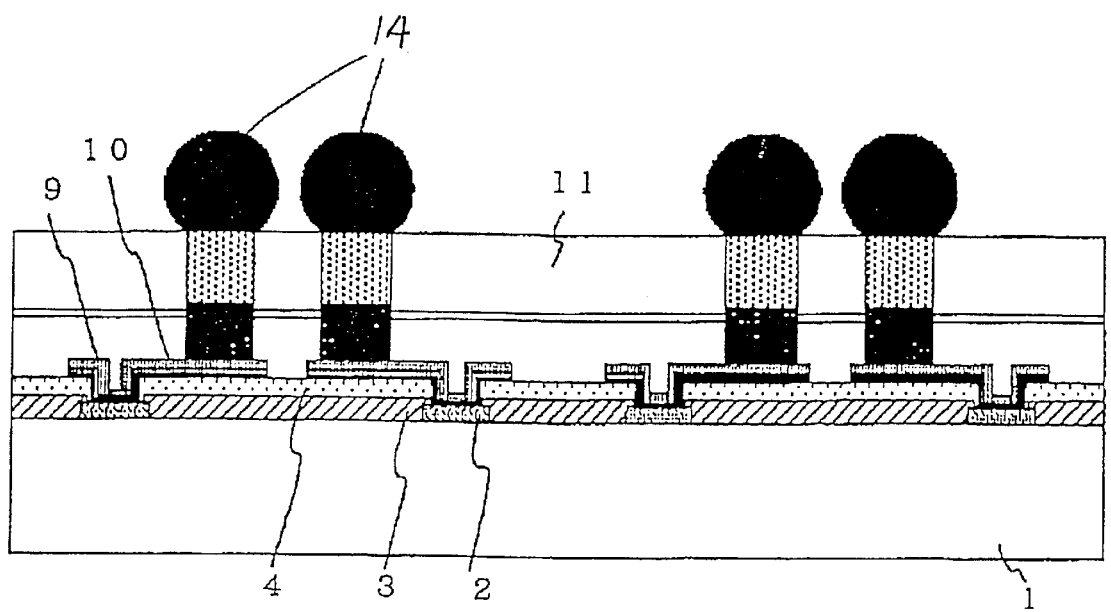
FIG. 4 is a fragmentary cross sectional elevation view illustrative of a second novel repairable flip-chip semiconductor device with solder bumps in a second embodiment in accordance with the present invention.

A second embodiment according to the present invention will be described in detail with reference to the drawings. FIG. 4 is a fragmentary cross sectional elevation view illustrative of a second novel repairable flip-chip semiconductor device with solder bumps in a second embodiment in accordance with the present invention. Pad electrodes 2 are selectively provided on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further provided on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin. An insulating resin coating layer 4 is entirely provided which extends over the pad electrodes 2 and the passivation film 3. The insulating resin coating layer 4 may comprise an organic material such as a polyimide resin, wherein openings 4a are provided in the insulating resin coating layer 4. The openings 4a are positioned over the pad electrodes 2, so that the pad electrodes 2 are shown through the openings 4a. A pad electrode adhesive metal layer 6 serving as a base metal thin layer is selectively provided, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. A plated-feeding metal layer 7 is also selectively provided on the surface of the pad electrode adhesive metal layer 6. The plated-feeding metal layer 7 has a low electric resistance characteristic for post-serving as a plated-feeding layer. The plated-feeding metal layer 7 may comprise a metal layer such as a copper layer. A re-wiring layer 9 is selectively provided on the plated-feeding metal layer 7, wherein a part of the re-wiring layer 9 serves as an external terminal formation land portion 10.

An inter-level insulating resin layer 15 is provided over the semiconductor wafer 1, so that the inter-level insulating resin layer 15 extends over the re-wiring layer 9 and the external terminal land portions 10 as well as over the insulating resin coating layer 4. The inter-level insulating resin layer 15 has a thickness of less than 100 micrometers. The inter-level insulating resin layer 15 is not to protect the surface of the semiconductor wafer 1, for which reason it is preferable that the inter-level insulating resin layer 15 comprises a soft resin having a softness close to the insulating resin coating layer 4. Through holes 15a are provided in the inter-level insulating resin layer 15, so that the through holes 15a are positioned over the external terminal land portions 10 of the re-wiring layer 9. Plated-posts 16 are provided in the through holes 15a in the inter-level insulating resin layer 15, so that bottoms of the plated-posts 16 are in contact directly with the top surfaces of the external terminal land portions 10 of the re-wiring layer 9. The plated-posts 16 have a height of about 100 micrometers, so that the top portions of the plated-posts 16 are slightly higher in level than or just equal to the top surface of the inter-level insulating resin layer 15. An insulating sheet 11 is provided over the inter-level insulating resin layer 15 via an adhesive layer 12, wherein the insulating sheet 11 and the adhesive layer 12 have through holes 11a having the same pattern as the plated-posts 16. Namely, the adhesive layer 12 extends over the inter-level insulating resin layer 15, while the through holes 11a are positioned over the plated-posts 16. The through holes 11a are aligned to the plated-posts 16, so that the plated-posts 16 are shown through the through holes 11a. A solder paste is filled into the through holes 11a to form post-electrodes 13 in the through holes 11a, wherein the bottoms of the post-electrodes 13 are in contact with the plated-posts 16. Spherical solder bumps 14 are provided over the post-electrodes 13, so that the spherical solder bumps 14 are in contact with the top surfaces of the post-electrodes 13.

Figure 5A:
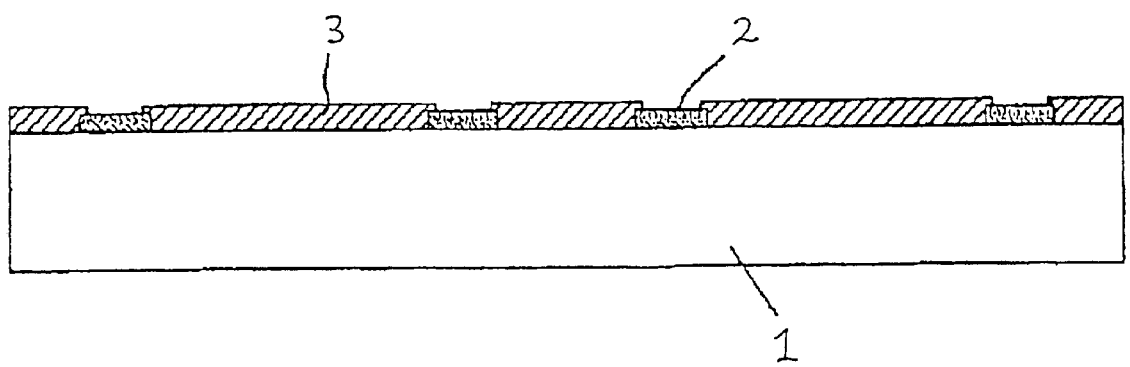
FIGS. 5A through 5O are fragmentary cross sectional elevation views illustrative of second novel repairable flip-chip semiconductor devices with solder bumps in sequential steps involved in a second novel fabrication method in a second embodiment in accordance with the present invention.
Figure 5B:
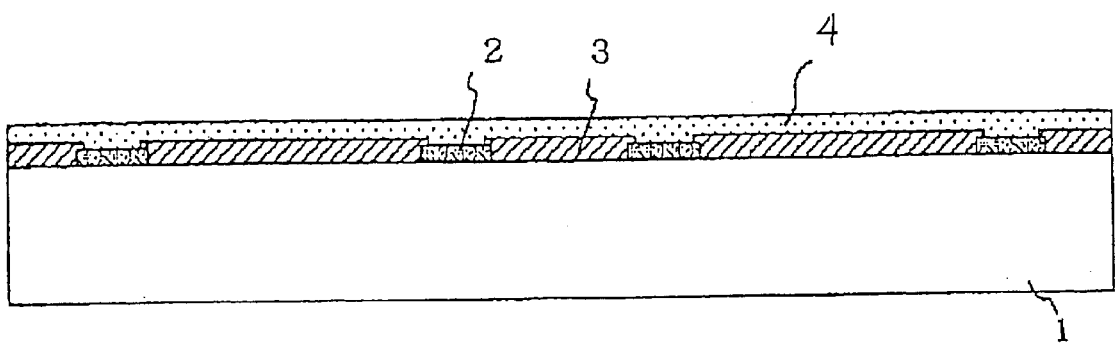
Figure 5C:
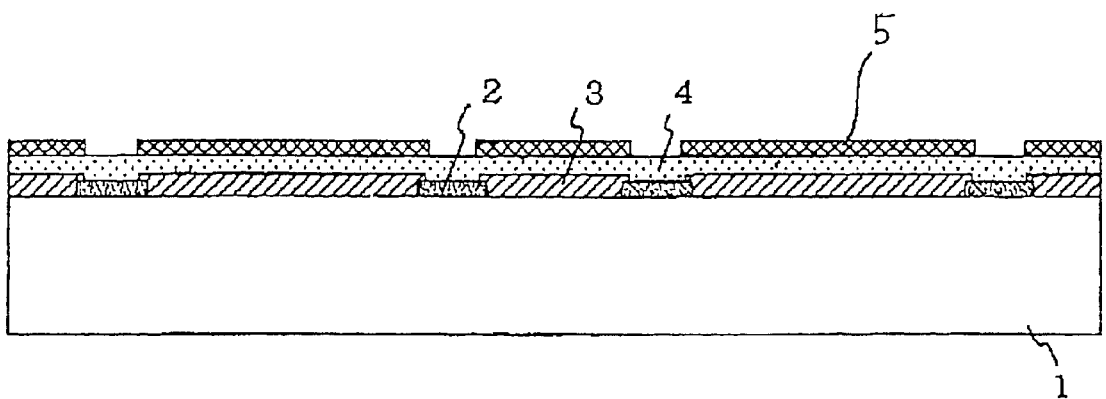
Figure 5D:
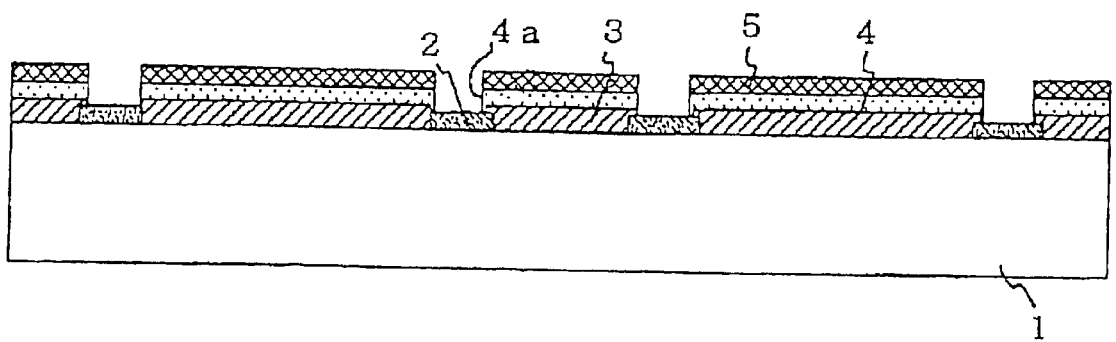
Figure 5E:
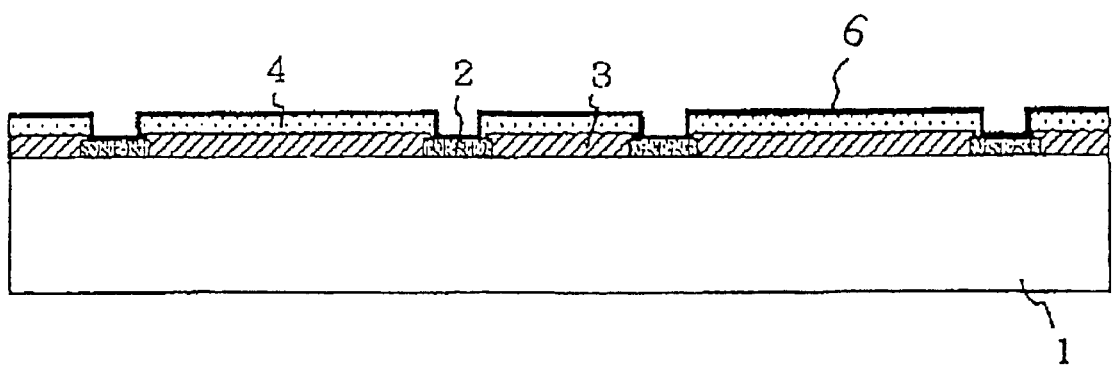
Figure 5F:
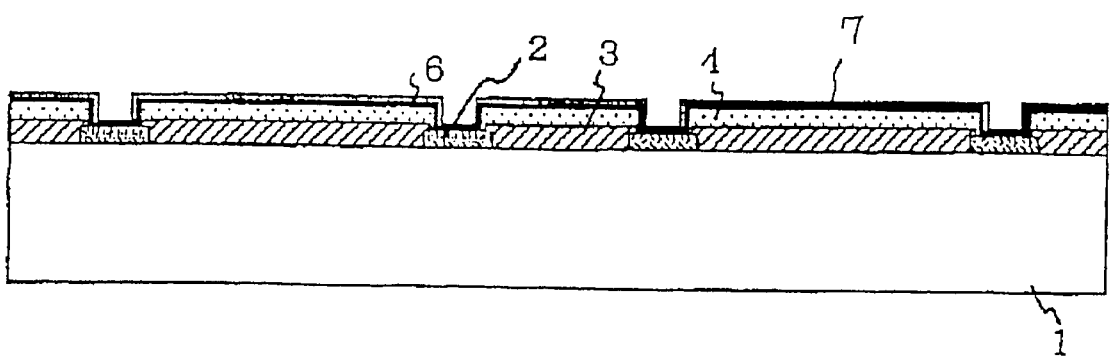
Figure 5G:
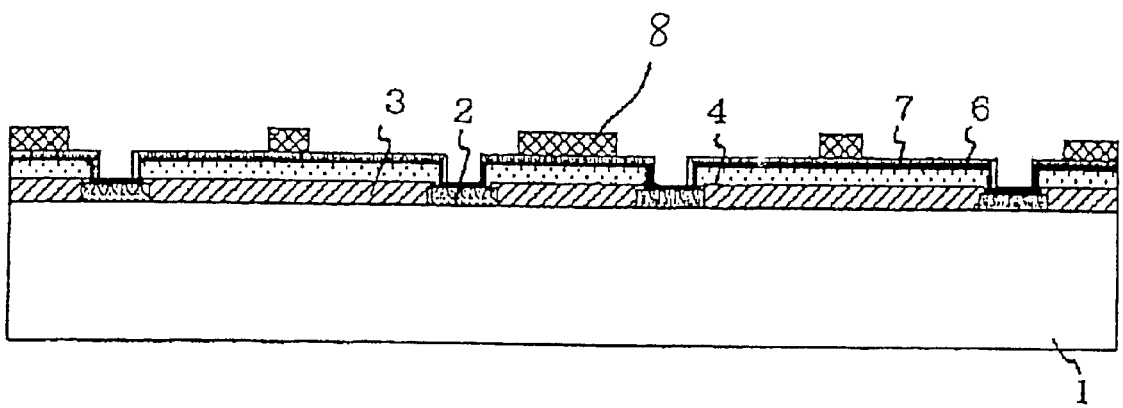
Figure 5H:
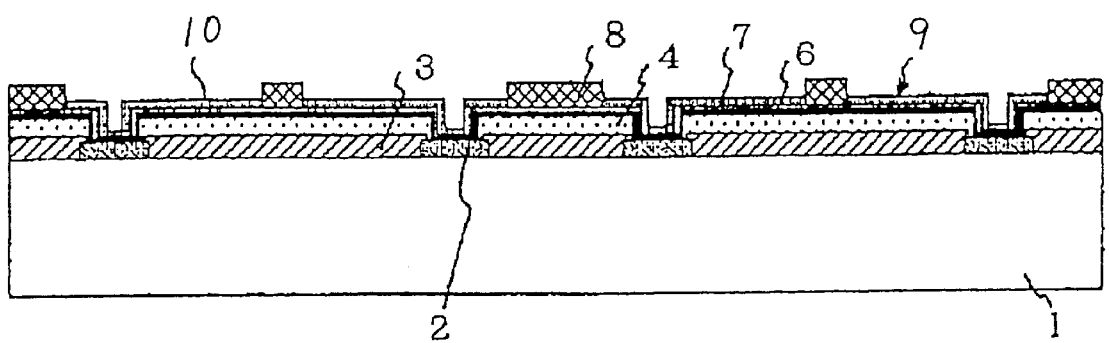
Figure 5I:
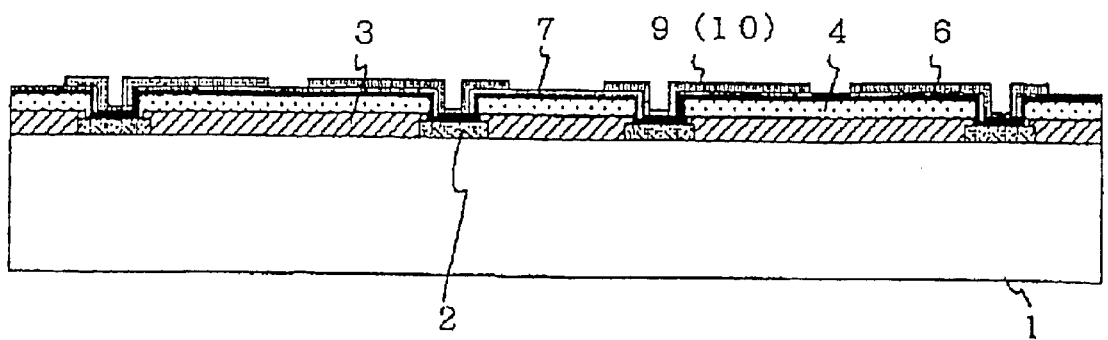
Figure 5J:
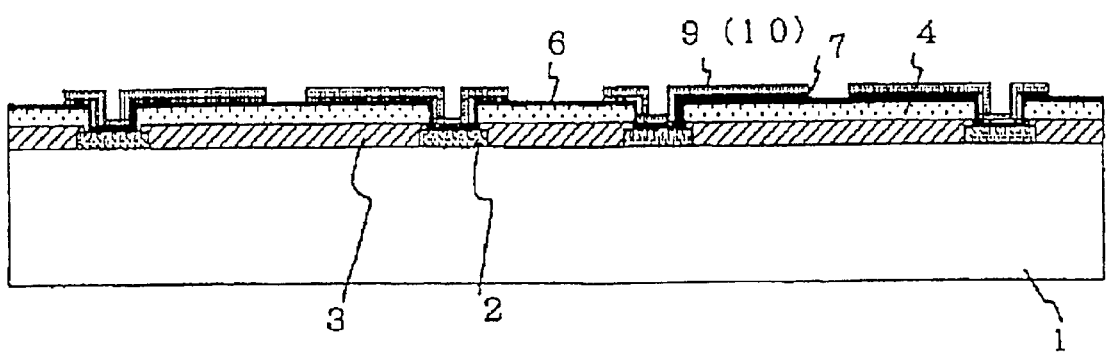
Figure 5K:
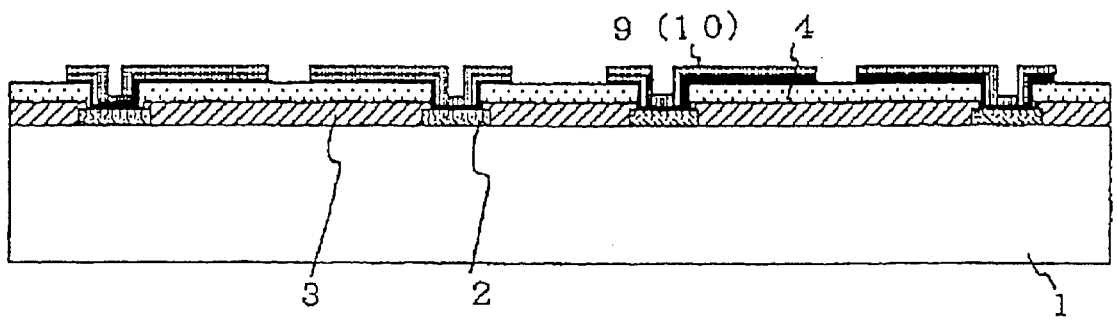
Figure 5L:
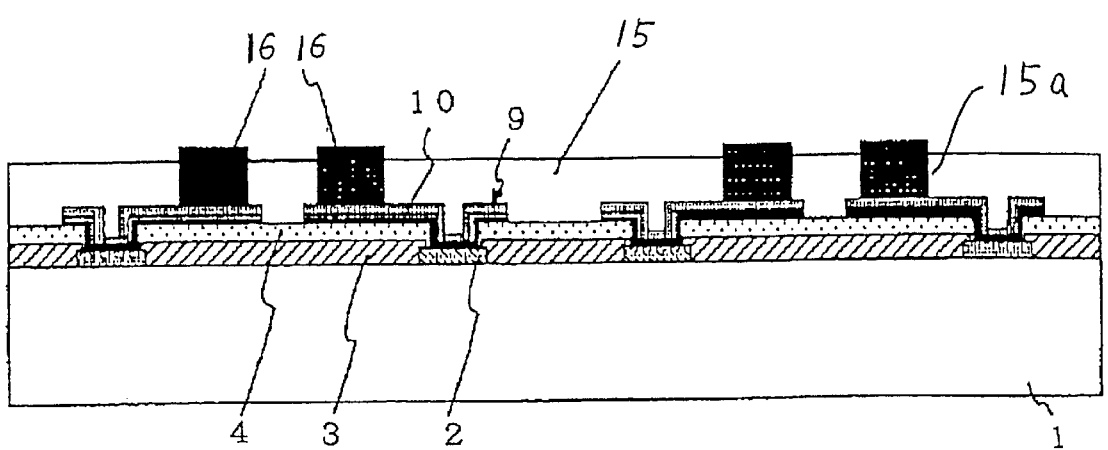
Figure 5M:
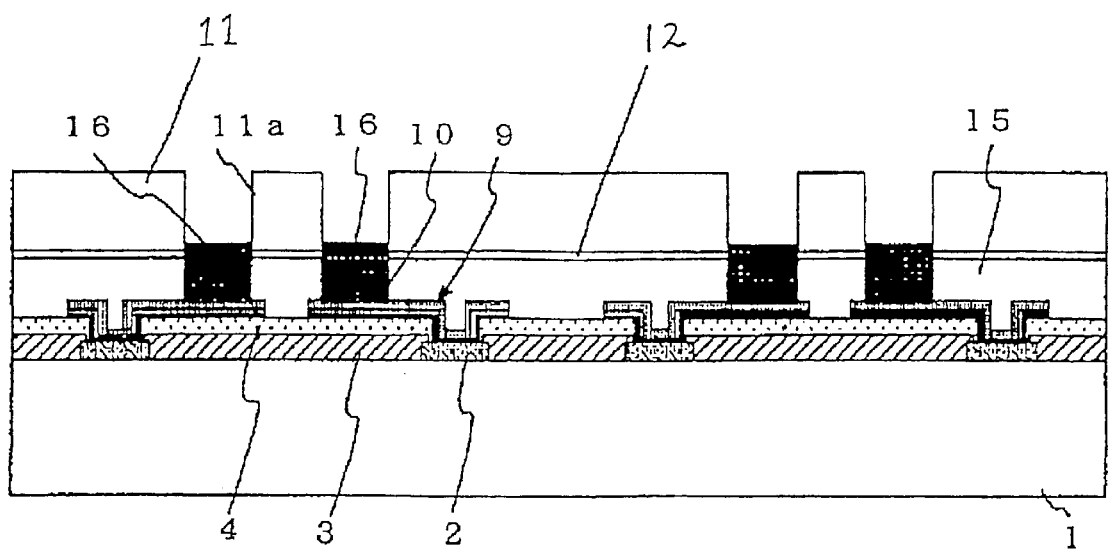
Figure 5N:
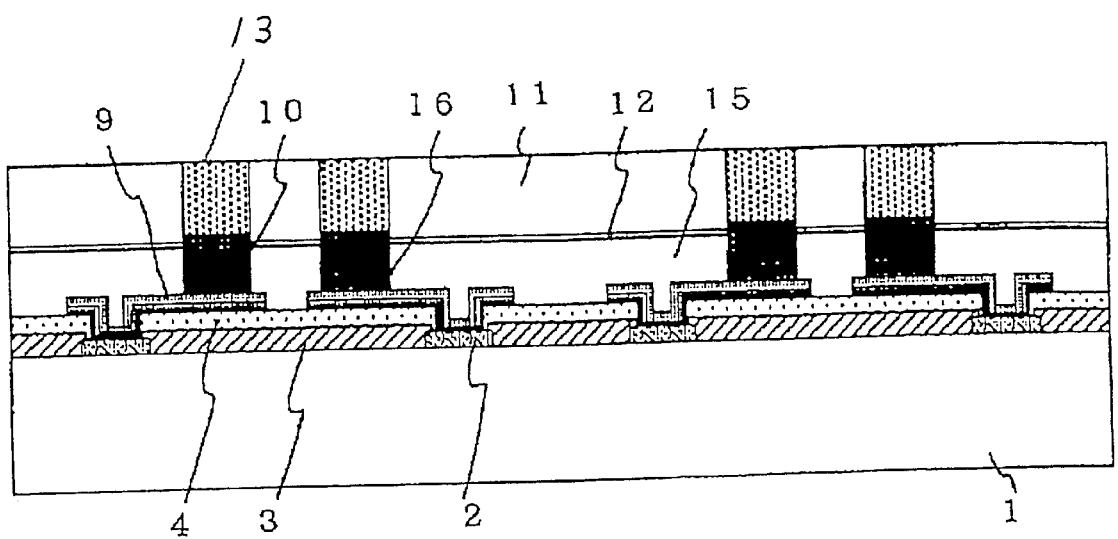
Figure 5O:
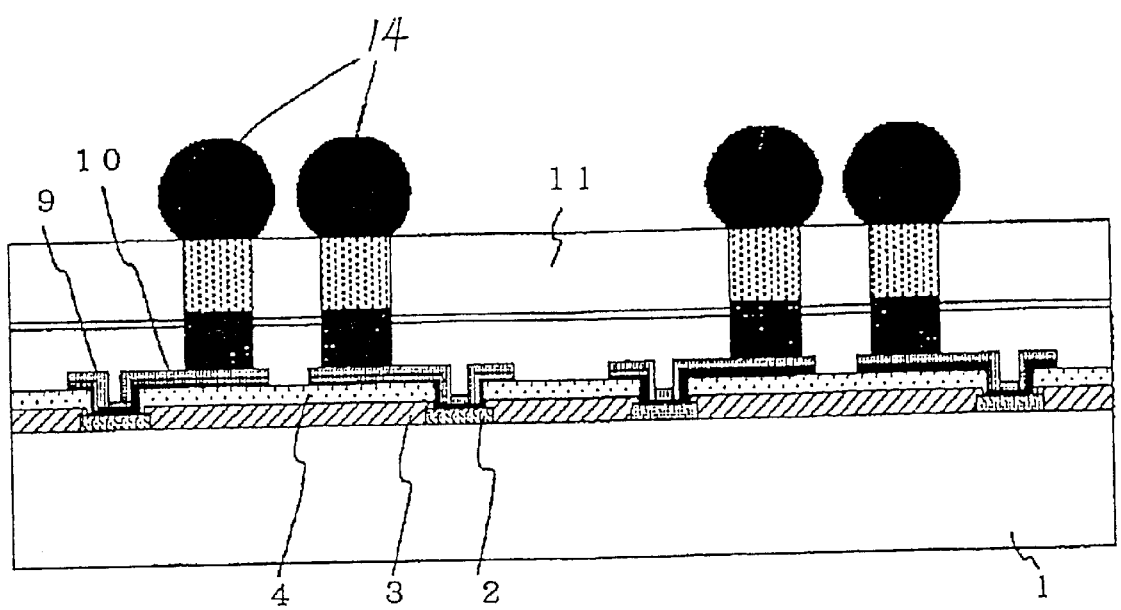

FIGS. 5A through 5O are fragmentary cross sectional elevation views illustrative of second novel repairable flip-chip semiconductor devices with solder bumps in sequential steps involved in a second novel fabrication method in a second embodiment in accordance with the present invention.

With reference to FIG. 5A, pad electrodes 2 are selectively formed on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further formed on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin.

With reference to FIG. 5B, an insulating resin coating layer 4 is entirely formed which extends over the pad electrodes 2 and the passivation film 3. The insulating resin coating layer 4 may comprise an organic material such as a polyimide resin, wherein the insulating resin for the insulating resin coating layer 4 has a thermal decomposition temperature of not less than 200° C. It is possible that the insulating resin for the insulating resin coating layer 4 is blended with a thermosetting resin material. In this case, a heat treatment is carried out at such a temperature as to cause a crosslinking reaction of the resin components or obtaining desired properties of the insulating resin coating layer 4.

With reference to FIG. 5C, a photo-resist film is entirely applied on a top surface of the insulating resin coating layer 4. The photo-resist film is then subjected to an exposure and subsequent development to form a photo-resist pattern 5 over the top surface of the insulating resin coating layer 4.

With reference to FIG. 5D, the photo-resist pattern 5 is used as a mask to carry out an anisotropic etching to the insulating resin coating layer 4, whereby openings 4a are formed in the insulating resin coating layer 4. The openings 4a are positioned over the pad electrodes 2, so that the pad electrodes 2 are shown through the openings 4a. The used photo-resist pattern 5 is then removed. It is alternatively possible that the insulating resin coating layer 4 may comprise a photosensitive resin material. In this case, it is unnecessary to form the photo-resist pattern, and it is possible that the photosensitive resin coating layer is subjected to an exposure and a subsequent development for patterning the photosensitive resin coating layer, whereby the openings 4a are formed in the photosensitive resin coating layer 4 and positioned over the pad electrodes 2, so that the pad electrodes 2 are shown through the openings 4a.

With reference to FIG. 5E, a pad electrode adhesive metal layer 6 serving as a base metal thin layer is entirely deposited by a sputtering method, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. For example, titanium-based alloys or chromium may be available for the pad electrode adhesive metal layer 6. It may optionally be possible that, prior to the formation of the pad electrode adhesive metal layer 6, the surfaces of the pad electrodes 2 are subjected to a plasma surface treatment for cleaning the surfaces of the pad electrodes 2 and also for improving the activity of the surfaces of the pad electrodes 2, so that the pad electrode adhesive metal layer 6 is deposited on the highly clean and highly activated surfaces of the pad electrodes 2.

With reference to FIG. 5F, a plated-feeding metal layer 7 is also entirely deposited by a sputtering method on the surface of the pad electrode adhesive metal layer 6. The plated-feeding metal layer 7 has a low electric resistance characteristic for post-serving as a plated-feeding layer when a re-wiring layer is later formed over the pad electrode adhesive metal layer 6. The plated-feeding metal layer 7 may comprise a metal layer such as a copper layer.

With reference to FIG. 5G, a photo-resist film is entirely applied on the plated-feeding metal layer 7. The photo-resist film is then subjected to an exposure and a subsequent development for patterning the photo-resist film, thereby forming a photo-resist pattern 8, wherein the plated-feeding metal layer 7 is shown and exposed in predetermined re-wiring pattern regions.

With reference to FIG. 5H, a re-wiring layer 9 is formed on the exposed surfaces of the plated-feeding metal layer 7 by a selective electroplating process of copper using the photo-resist pattern 8 as a mask, wherein a part of the re-wiring layer 9 serves as an external terminal formation land portion 10.

With reference to FIG. 5I, the used photo-resist pattern 8 is removed, whereby the re-wiring layer 9 and the plated-feeding metal layer 7 are shown.

With reference to FIG. 5J, a selective wet etching process is carried out by using the re-wiring layer 9 as a mask for selectively etch the plated-feeding metal layer 7, whereby the pad electrode adhesive metal layer 6 are partially shown.

With reference to FIG. 5K, the pad electrode adhesive metal layer 6 is also subjected to the continuous selective wet etching process by using the re-wiring layer 9 as a mask for further selectively etch the pad electrode adhesive metal layer 6, whereby the insulating resin coating layer 4 is partially shown, resulting in that re-wiring patterns, each of which is electrically floated, are thus formed.

With reference to FIG. 5L, an inter-level insulating resin layer 15 is formed over the semiconductor wafer 1, so that the inter-level insulating resin layer 15 extends over the re-wiring layer 9 and the external terminal land portions 10 as well as over the insulating resin coating layer 4. The inter-level insulating resin layer 15 has a thickness of less than 100 micrometers. The inter-level insulating resin layer 15 is not to protect the surface of the semiconductor wafer 1, for which reason it is preferable that the inter-level insulating resin layer 15 comprises a soft resin having a softness close to the insulating resin coating layer 4. Through holes 15a are formed in the inter-level insulating resin layer 15, so that the through holes 15a are positioned over the external terminal land portions 10 of the re-wiring layer 9. Plated-posts 16 are formed in the through holes 15a in the inter-level insulating resin layer 15, so that bottoms of the plated-posts 16 are in contact directly with the top surfaces of the external terminal land portions 10 of the re-wiring layer 9. The plated-posts 16 have a height of about 100 micrometers, so that the top portions of the plated-posts 16 are slightly higher in level than or just equal to the top surface of the inter-level insulating resin layer 15.

With reference to FIG. 5M, an insulating sheet 11 is formed over the inter-level insulating resin layer 15 via an adhesive layer 12, wherein the insulating sheet 11 and the adhesive layer 12 have through holes 11a having the same pattern as the plated-posts 16. Namely, the adhesive layer 12 extends over the inter-level insulating resin layer 15, while the through holes 11a are positioned over the plated-posts 16. The through holes 11a are aligned to the plated-posts 16, so that the plated-posts 16 are shown through the through holes 11a. The alignment of the insulating sheet 11 may easily be carried out by putting an alignment mark on the insulating sheet 11 for alignment of the alignment mark on the insulating sheet 11 to a predetermined position of the semiconductor wafer 1.

With reference to FIG. 5N, a solder paste is filled into the through holes 11a to form post-electrodes 13 in the through holes 11a, wherein the bottoms of the post-electrodes 13 are in contact with the plated-posts 16.

With reference to FIG. 5O, spherical solder bumps 14 are formed over the post-electrodes 13, so that the spherical solder bumps 14 are in contact with the top surfaces of the post-electrodes 13. Subsequently, a heat treatment is carried out to unite the spherical solder bumps 14 with the post-electrodes 13. Instead of placing the spherical solder bumps 14 on the top surfaces of the post-electrodes 13, it is also possible that a solder paste is printed on the top surfaces of the post-electrodes 13. The semiconductor wafer 1 is divided by a dicing blade into plural semiconductor chips 1A, whereby plural flip-chip semiconductor devices are formed.

A non-defective semiconductor chip 1A with the solder bumps 14 as formed in the above described method are then flip-chip-mounted on a multilayer circuit board, wherein the solder bumps 14 are made into contact with pad electrodes of the multilayer circuit board. If the multilayer circuit board is defective, it is necessary to remove the non-defective semiconductor chip 1A from the defective multilayer circuit board, and then repair the non-defective semiconductor chip 1A to a new non-defective multilayer circuit board. For this purpose, an adsorbing and heating tool is made into contact with an opposite surface of the non-defective semiconductor chip 1A to the surface having the solder bumps 14 and facing to the defective multilayer circuit board. The adsorbing and heating tool has heaters for heating the non-defective semiconductor chip 1A with the solder bumps 14. The adsorbing and heating tool is capable of vacuum adsorption with the non-defective semiconductor chip 1A and also the heaters generate heats to be transmitted through the non-defective semiconductor chip 1A to the solder bumps 14, whereby bonding portions of the solder bumps 14 to electrode pads of the defective multilayer circuit board are melt. In this state, the adsorbing and heating tool performing the vacuum adsorption with the non-defective semiconductor chip 1A is moved upwardly to remove the non-defective semiconductor chip 1A from the defective multilayer circuit board. The non-defective semiconductor chip 1A is peeled from the defective multilayer circuit board for subsequent repairing the non-defective semiconductor chip 1A to a new non-defective multilayer circuit board. The non-defective semiconductor chip 1A is peeled from the defective multilayer circuit board by the mechanical force due to the vacuum adsorption after the solder bumps 14 have sufficiently be heated by the heat conduction from the heaters through the non-defective semiconductor chip 1A. In accordance with the present invention, however, the insulating resin coating layer 4 is provided over passivation film 3, wherein the insulating resin coating layer 4 serves as a stress-buffer layer. Further, the external terminal land portions 10 of the re-wiring layer 9 are provided over the insulating resin coating layer 4. The post electrodes 13 are provided over the external terminal land portions 10 of the re-wiring layer 9, and the solder bumps 14 are provided on the post electrodes 13. The heat and the mechanical force applied by the adsorbing and heating tool result in thermal and mechanical stresses appearing on the solder bumps 14. The insulating resin coating layer 4 isolates and protects the passivation film 3 and the active regions of the semiconductor substrate under the passivation film from the thermal and mechanical stresses. Namely, the insulating resin coating layer 4 isolates and protects the semiconductor chip from the thermal and mechanical stresses.

The insulating sheet 11 is provided over the inter-level insulating resin layer 15 via the adhesive layer 12, so that the insulating sheet 11 serves as a protecting layer for protecting the re-wiring layer 9 having the external terminal land portions 10 and the pad electrodes 2. The insulating sheet 11 is indirectly contact with the re-wiring layer 9 having the external terminal land portions 10. The adhesive layer 12 is interposed between the insulating sheet 11 and the inter-level insulating resin layer 15 which extends over the re-wiring layer 9 having the external terminal land portions 10. Namely, the adhesive layer 12 is interposed between the insulating sheet 11 and the inter-level insulating resin layer 15. The provision of the adhesive layer 12 between the insulating sheet 11 and the inter-level insulating resin layer 15 results in that the temperature history causes no thermal stress between the insulating sheet 11 and the inter-level insulating resin layer 15. No thermal stress between the insulating sheet 11 and the inter-level insulating resin layer 15 causes no bending of the semiconductor chip or the semiconductor wafer nor crack in the insulating sheet 11.

Since the inter-level insulating resin layer 15 has substantially the same softness as the insulating resin coating layer 4, no thermal stress is generated in the inter-level insulating resin layer 15. Further, the provision of the inter-level insulating resin layer 15 makes it possible to reduce the thickness of the adhesive layer 12.

Furthermore, the insulating sheet 11 and the adhesive layer 12 have the through holes 11a which correspond in position to the external terminal land portions 10 of the re-wiring layer 9. For this reason, it is unnecessary to carry out any process for forming openings or through holes in the insulating sheet 11 and the adhesive layer 12 after the insulating sheet 11 and the adhesive layer 12 have been formed over the semiconductor wafer 1. This means the reduction in the number of the necessary manufacturing processes, whereby it is possible to reduce the manufacturing cost. Since the through holes 11a have already been formed in the insulating sheet 11 before the insulating sheet 11 with the through holes 11a are formed over the semiconductor wafer 1, then it is possible to use a laser for forming the through holes 11a in the insulating sheet 11. The laser method is able to form the through holes 11a so that the cross sectional elevation shape of the through holes 11a is tapered, which fits to the spherical shape solder bumps 14.

In this embodiment, the through holes 15a are formed in the inter-level insulating resin layer 15 for subsequent formation of the plated-posts 16 in the through holes 15a. It is, however, optionally, possible as a modification that the plated-posts 16 are selectively formed by use of the lithography technique before the inter-level insulating resin layer 15 is then formed by a coating method without any process for forming the through holes 15a. This results in the reduction in the number of the manufacturing processes, whereby the manufacturing cost is further reduced.

Third Embodiment

Figure 6:
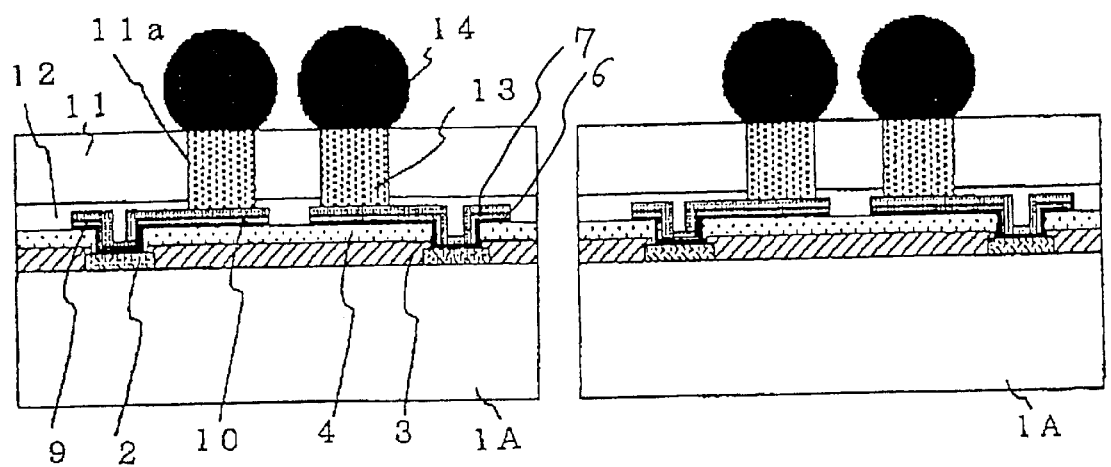
FIG. 6 is a fragmentary cross sectional elevation view illustrative of a third novel repairable flip-chip semiconductor device with solder bumps in a third embodiment in accordance with the present invention.

A third embodiment according to the present invention will be described in detail with reference to the drawings. FIG. 6 is a fragmentary cross sectional elevation view illustrative of a third novel repairable flip-chip semiconductor device with solder bumps in a third embodiment in accordance with the present invention. Pad electrodes 2 are selectively provided on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further provided on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as $SiO_2$ or an organic material such as a polyimide resin. An insulating resin coating layer 4 is entirely provided which extends over the pad electrodes 2 and the passivation film 3. The insulating resin coating layer 4 may comprise an organic material such as a polyimide resin, wherein openings 4a are provided in the insulating resin coating layer 4. The openings 4a are positioned over the pad electrodes 2, so that the pad electrodes 2 are shown through the openings 4a. A pad electrode adhesive metal layer 6 serving as a base metal thin layer is selectively provided, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. A plated-feeding metal layer 7 is also selectively provided on the surface of the pad electrode adhesive metal layer 6. The plated-feeding metal layer 7 has a low electric resistance characteristic for post-serving as a plated-feeding layer. The plated-feeding metal layer 7 may comprise a metal layer such as a copper layer. A re-wiring layer 9 is selectively provided on the plated-feeding metal layer 7, wherein a part of the re-wiring layer 9 serves as an external terminal formation land portion 10.

An insulating sheet 11 is provided over the semiconductor wafer 1 via an adhesive layer 12, wherein the insulating sheet 11 and the adhesive layer 12 have through holes 11a having the same pattern as the external terminal land portions 10 of the re-wiring layer 9. Namely, the adhesive layer 12 extends over the re-wiring layer 9, and the insulating resin coating layer 4, while the through holes 11a are positioned over the external terminal land portions 10 of the re-wiring layer 9. The through holes 11a are aligned to the external terminal land portions 10 of the re-wiring layer 9. Post-electrodes 13 are provided in the through holes 11a, wherein the bottoms of the post-electrodes 13 are in contact with the external terminal land portions 10 of the re-wiring layer 9. Spherical solder bumps 14 are provided over the post-electrodes 13, so that the spherical solder bumps 14 are in contact with the top surfaces of the post-electrodes 13.

Figure 7A:
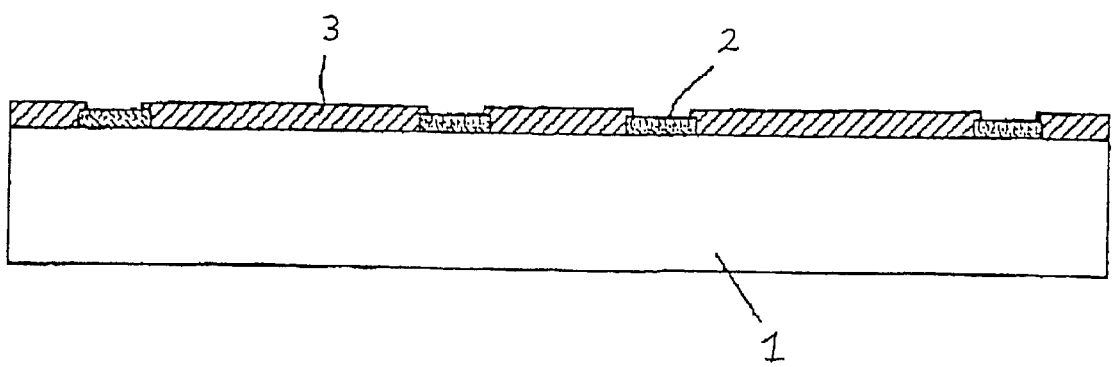
FIGS. 7A through 7R are fragmentary cross sectional elevation views illustrative of third novel repairable flip-chip semiconductor devices with solder bumps in sequential steps involved in a third novel fabrication method in a third embodiment in accordance with the present invention.
Figure 7B:
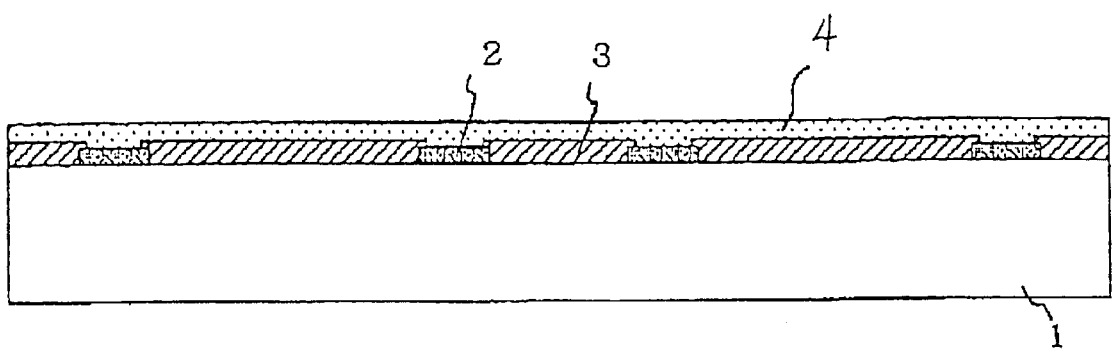
Figure 7C:
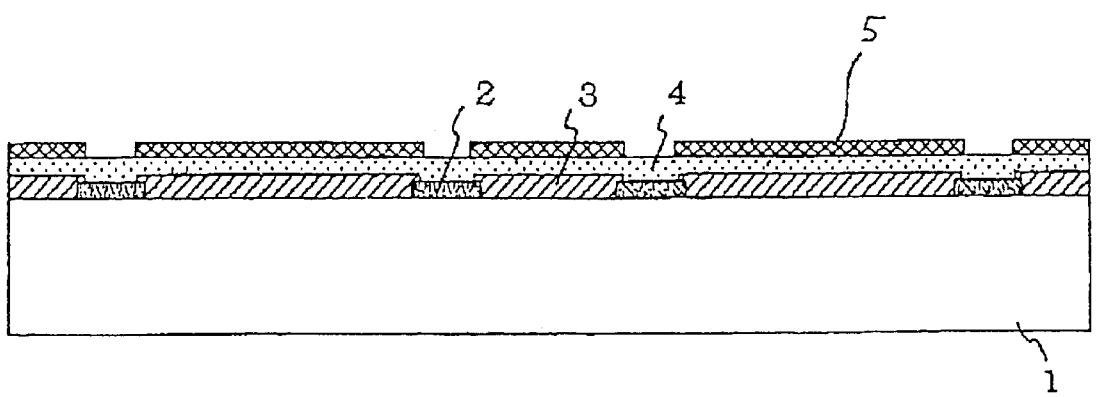
Figure 7D:
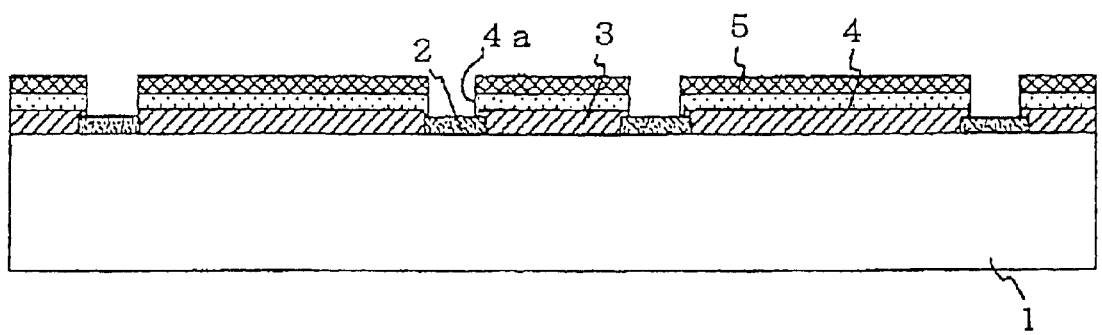
Figure 7E:
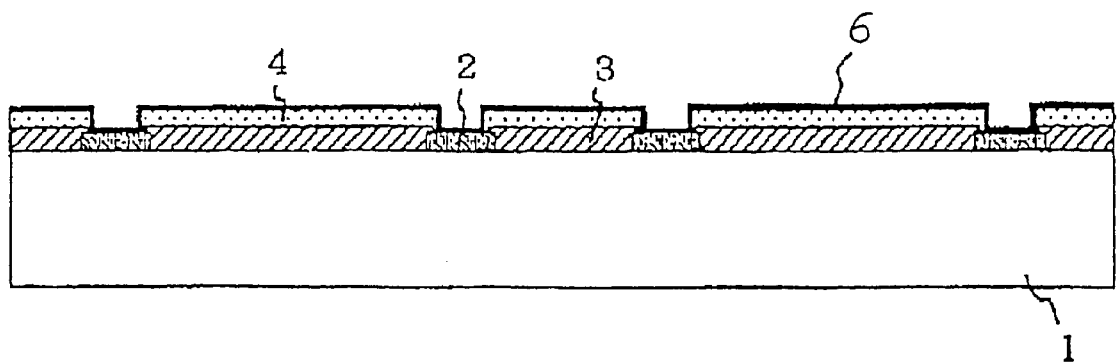
Figure 7F:
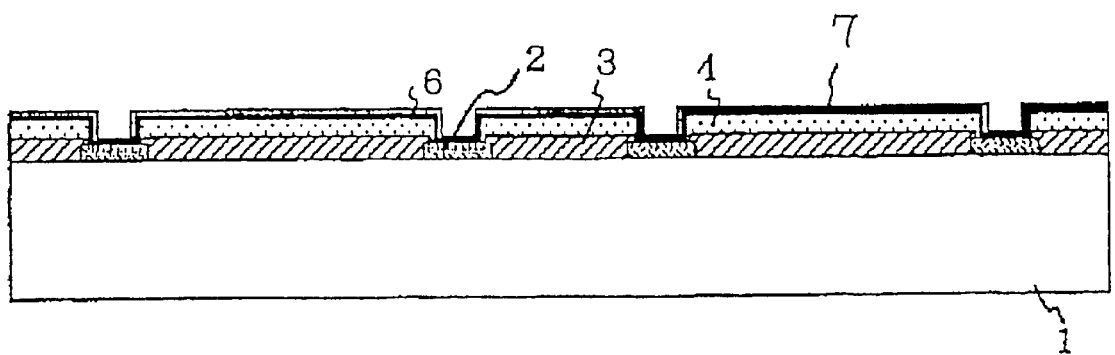
Figure 7G:
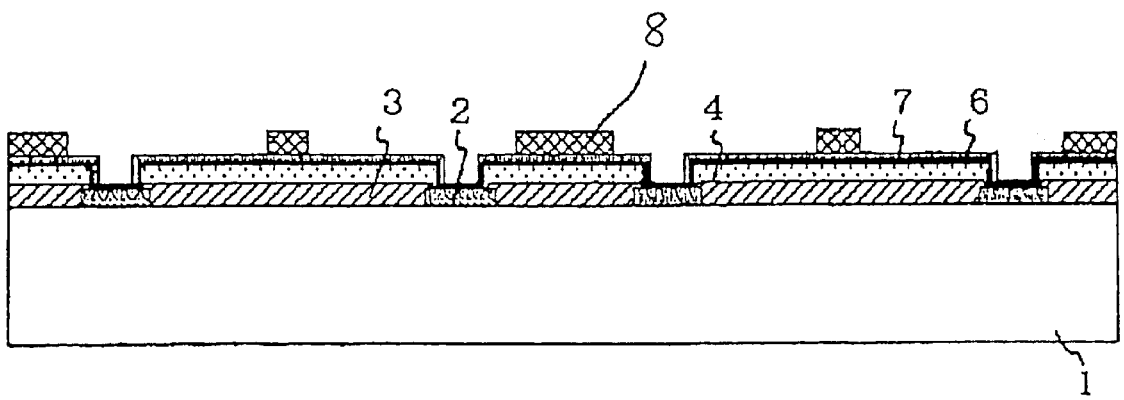
Figure 7H:
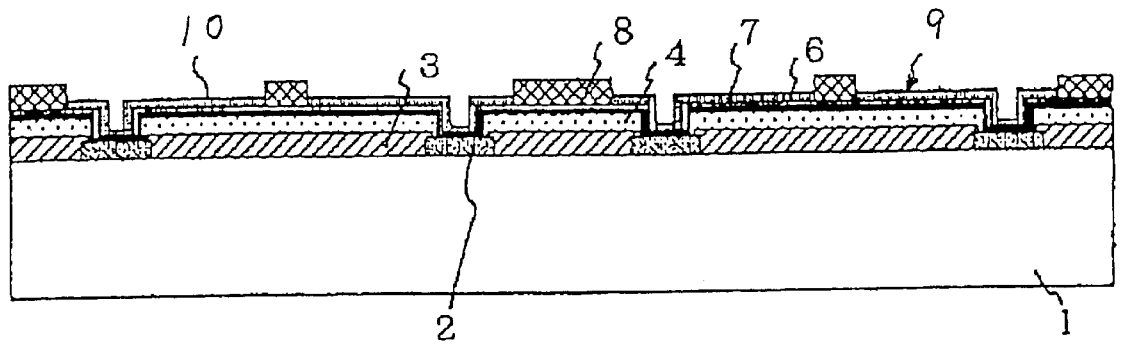
Figure 7I:
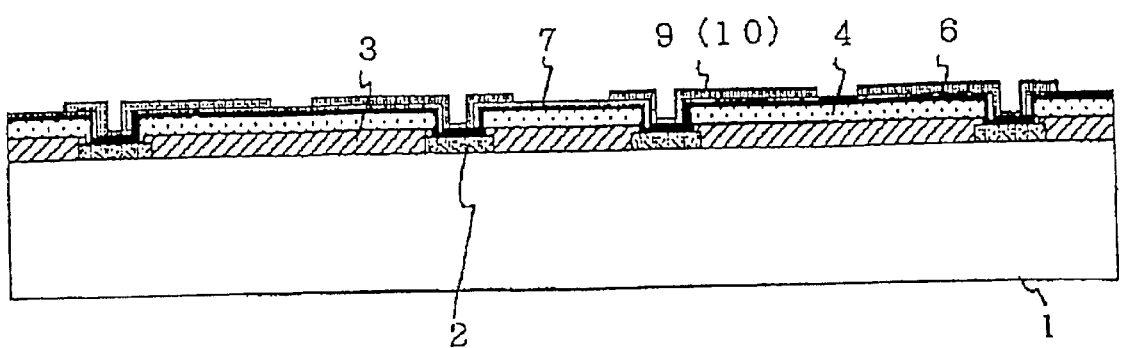
Figure 7J:
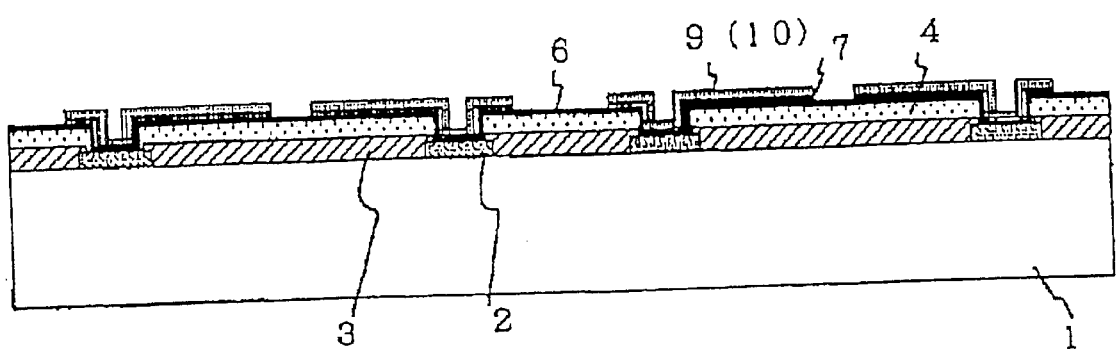
Figure 7K:
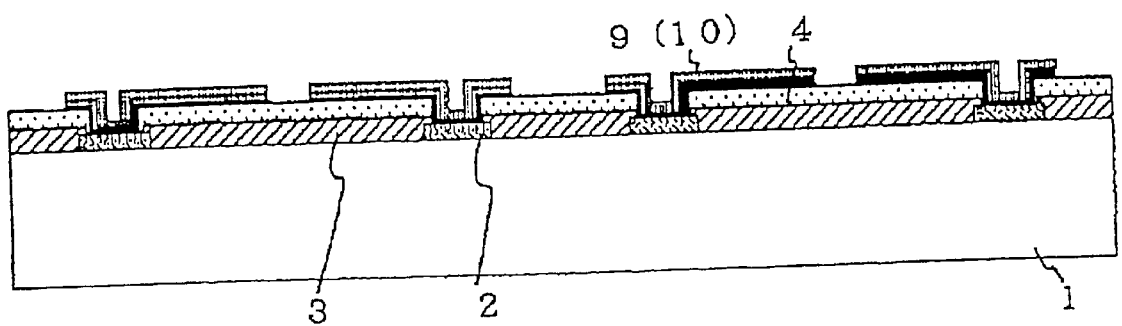
Figure 7L:
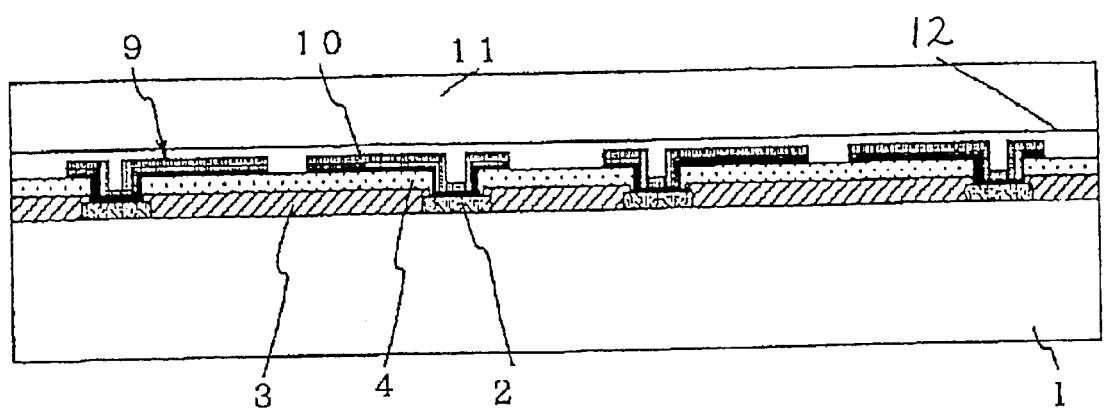
Figure 7M:
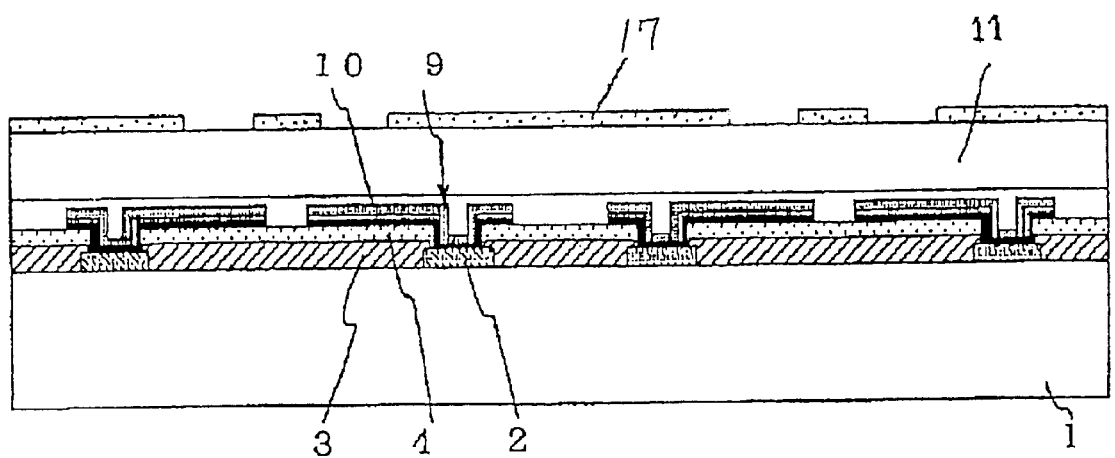
Figure 7N:
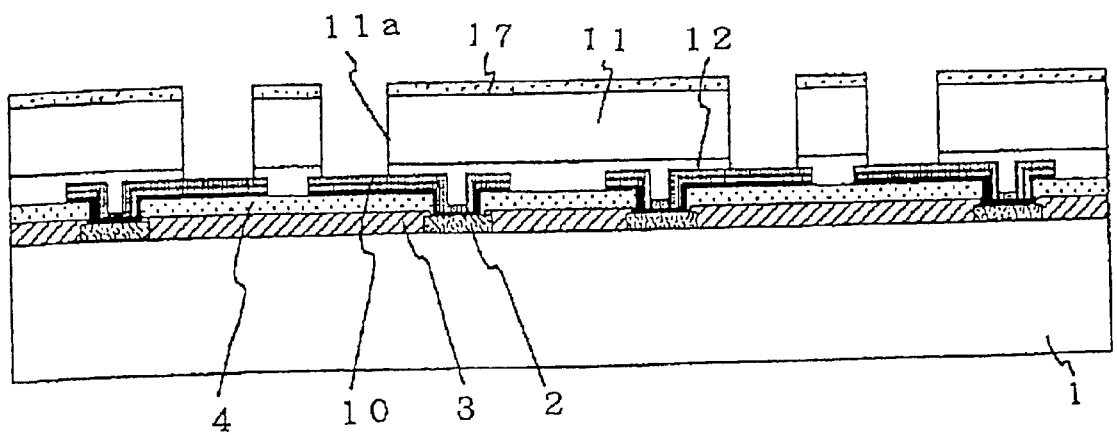
Figure 70:
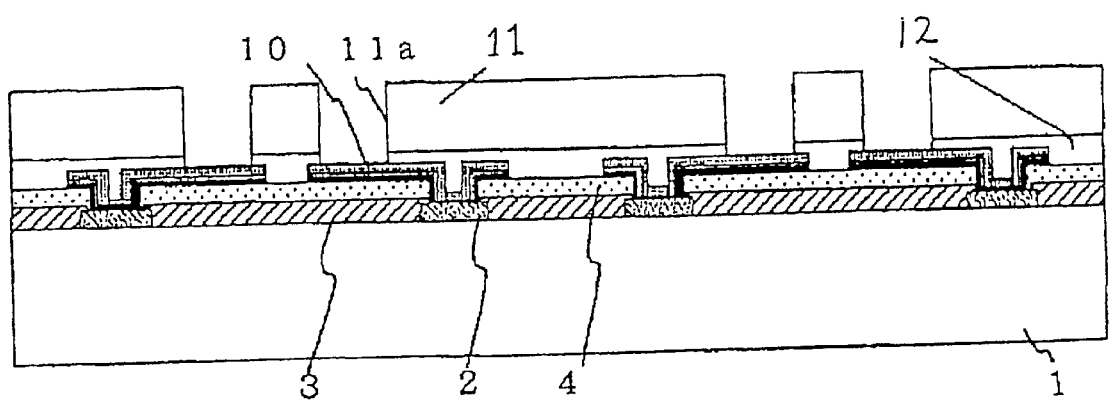
Figure 7P:
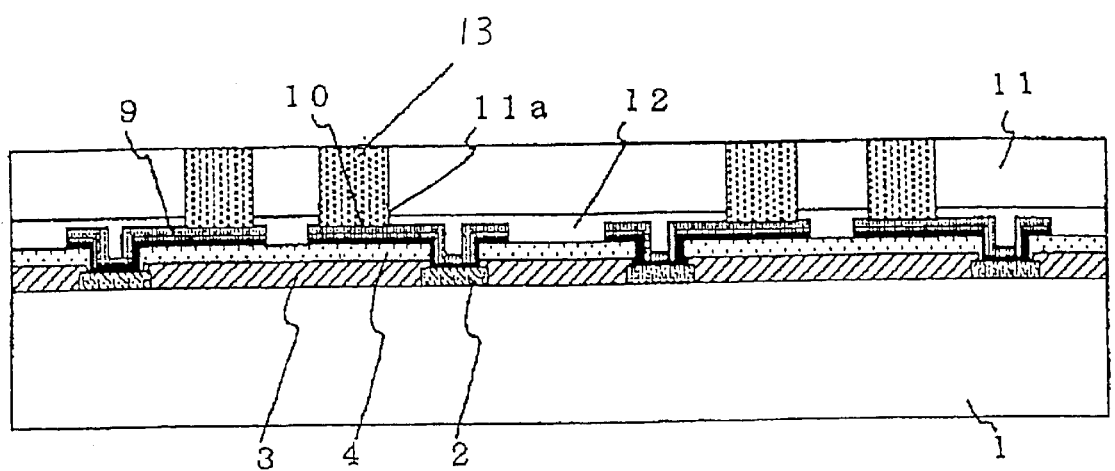
Figure 7Q:
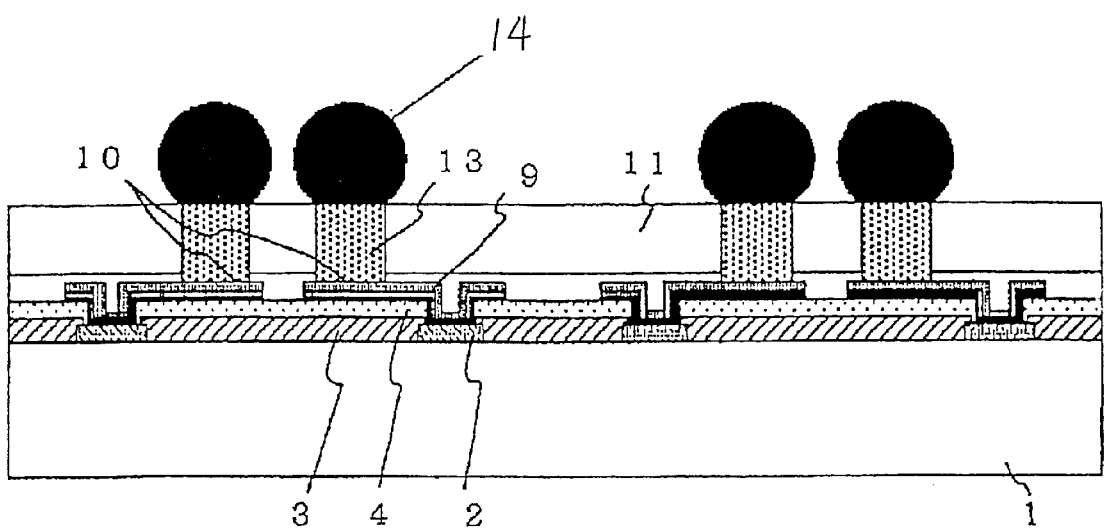
Figure 7R:
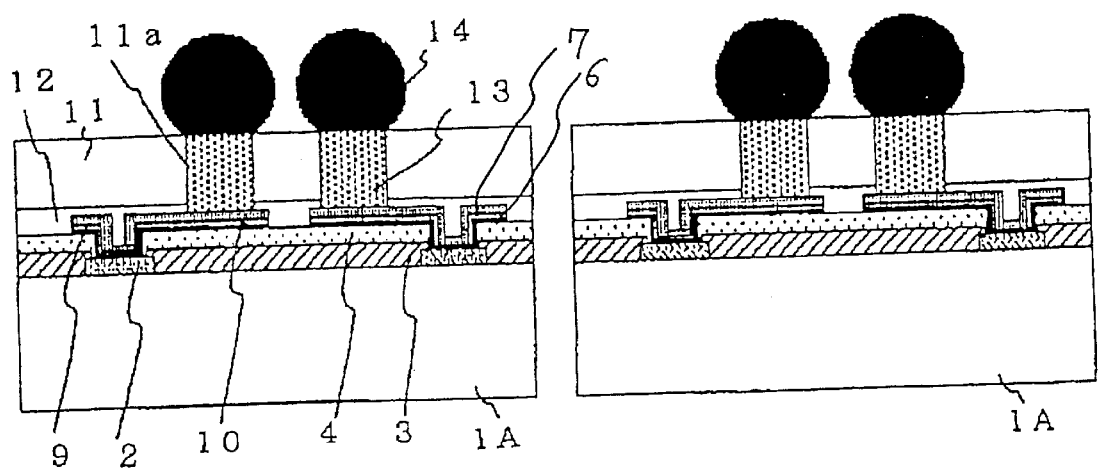

FIGS. 7A through 7R are fragmentary cross sectional elevation views illustrative of third novel repairable flip-chip semiconductor devices with solder bumps in sequential steps involved in a third novel fabrication method in a third embodiment in accordance with the present invention.

With reference to FIG. 7A, pad electrodes 2 are selectively formed on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further formed on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin.

With reference to FIG. 7B, an insulating resin coating layer 4 is entirely formed which extends over the pad electrodes 2 and the passivation film 3. The insulating resin coating layer 4 may comprise an organic material such as a polyimide resin, wherein the insulating resin for the insulating resin coating layer 4 has a thermal decomposition temperature of not less than 200° C. It is possible that the insulating resin for the insulating resin coating layer 4 is blended with a thermosetting resin material. In this case, a heat treatment is carried out at such a temperature as to cause a crosslinking reaction of the resin components or obtaining desired properties of the insulating resin coating layer 4.

With reference to FIG. 7C, a photo-resist film is entirely applied on a top surface of the insulating resin coating layer 4. The photo-resist film is then subjected to an exposure and subsequent development to form a photo-resist pattern 5 over the top surface of the insulating resin coating layer 4.

With reference to FIG. 7D, the photo-resist pattern 5 is used as a mask to carry out an anisotropic etching to the insulating resin coating layer 4, whereby openings 4a are formed in the insulating resin coating layer 4. The openings 4a are positioned over the pad electrodes 2, so that the pad electrodes 2 are shown through the openings 4a. The used photo-resist pattern 5 is then removed. It is alternatively possible that the insulating resin coating layer 4 may comprise a photosensitive resin material. In this case, it is unnecessary to form the photo-resist pattern, and it is possible that the photosensitive resin coating layer is subjected to an exposure and a subsequent development for patterning the photosensitive resin coating layer, whereby the openings 4a are formed in the photosensitive resin coating layer 4 and positioned over the pad electrodes 2, so that the pad electrodes 2 are shown through the openings 4a.

With reference to FIG. 7E, a pad electrode adhesive metal layer 6 serving as a base metal thin layer is entirely deposited by a sputtering method, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. For example, titanium-based alloys or chromium may be available for the pad electrode adhesive metal layer 6. It may optionally be possible that, prior to the formation of the pad electrode adhesive metal layer 6, the surfaces of the pad electrodes 2 are subjected to a plasma surface treatment for cleaning the surfaces of the pad electrodes 2 and also for improving the activity of the surfaces of the pad electrodes 2, so that the pad electrode adhesive metal layer 6 is deposited on the highly clean and highly activated surfaces of the pad electrodes 2.

With reference to FIG. 7F, a plated-feeding metal layer 7 is also entirely deposited by a sputtering method on the surface of the pad electrode adhesive metal layer 6. The plated-feeding metal layer 7 has a low electric resistance characteristic for post-serving as a plated-feeding layer when a re-wiring layer is later formed over the pad electrode adhesive metal layer 6. The plated-feeding metal layer 7 may comprise a metal layer such as a copper layer.

With reference to FIG. 7G, a photo-resist film is entirely applied on the plated-feeding metal layer 7. The photo-resist film is then subjected to an exposure and a subsequent development for patterning the photo-resist film, thereby forming a photo-resist pattern 8, wherein the plated-feeding metal layer 7 is shown and exposed in predetermined re-wiring pattern regions.

With reference to FIG. 7H, a re-wiring layer 9 is formed on the exposed surfaces of the plated-feeding metal layer 7 by a selective electroplating process of copper using the photo-resist pattern 8 as a mask, wherein a part of the re-wiring layer 9 serves as an external terminal formation land portion 10.

With reference to FIG. 7I, the used photo-resist pattern 8 is removed, whereby the re-wiring layer 9 and the plated-feeding metal layer 7 are shown.

With reference to FIG. 7J, a selective wet etching process is carried out by using the re-wiring layer 9 as a mask for selectively etch the plated-feeding metal layer 7, whereby the pad electrode adhesive metal layer 6 are partially shown.

With reference to FIG. 7K, the pad electrode adhesive metal layer 6 is also subjected to the continuous selective wet etching process by using the re-wiring layer 9 as a mask for further selectively etch the pad electrode adhesive metal layer 6, whereby the insulating resin coating layer 4 is partially shown, resulting in that re-wiring patterns, each of which is electrically floated, are thus formed.

With reference to FIG. 7L, an insulating sheet 11 is entirely formed over the semiconductor wafer 1 via an adhesive layer 12, wherein the insulating sheet 11 and the adhesive layer 12 have no through holes. Namely, the adhesive layer 12 extends over the re-wiring layer 9, and the insulating resin coating layer 4 as well as over the external terminal land portions 10 of the re-wiring layer 9.

With reference to FIG. 7M, a photo-resist film is entirely applied on the top surface of the insulating sheet 11. The photo-resist film is subjected to an exposure and subsequent development to form a photo-resist pattern 17 over the top surface of the insulating sheet 11.

With reference to FIG. 7N, the photo-resist pattern 17 is used as a mask for carrying out a selective anisotropic etching to the insulating sheet 11 and the adhesive layer 12, thereby to form through holes 11a having the same pattern as the external terminal land portions 10 of the re-wiring layer 9. Namely, the adhesive layer 12 extends over the re-wiring layer 9, and the insulating resin coating layer 4, while the through holes 11a are positioned over the external terminal land portions 10 of the re-wiring layer 9, so that the external terminal land portions 10 of the re-wiring layer 9 are shown through the through holes 11a. It is optionally possible that the adhesive layer 12 may selectively be removed by a laser such as a CO2 laser or a YAG laser in place of the anisotropic etching.

With reference to FIG. 7O, the used photo-resist film 17 is removed.

With reference to FIG. 7P, a solder paste is filled into the through holes 11a to form post-electrodes 13 in the through holes 11a, wherein the bottoms of the post-electrodes 13 are in contact with the external terminal land portions 10 of the re-wiring layer 9.

With reference to FIG. 7Q, spherical solder bumps 14 are formed over the post-electrodes 13, so that the spherical solder bumps 14 are in contact with the top surfaces of the post-electrodes 13. Subsequently, a heat treatment is carried out to unite the spherical solder bumps 14 with the post-electrodes 13. Instead of placing the spherical solder bumps 14 on the top surfaces of the post-electrodes 13, it is also possible that a solder paste is printed on the top surfaces of the post-electrodes 13.

With reference to FIG. 7R, the semiconductor wafer 1 is divided by a dicing blade into plural semiconductor chips 1A, whereby plural flip-chip semiconductor devices are formed.

A non-defective semiconductor chip 1A with the solder bumps 14 as formed in the above described method are then flip-chip-mounted on a multilayer circuit board, wherein the solder bumps 14 are made into contact with pad electrodes of the multilayer circuit board. If the multilayer circuit board is defective, it is necessary to remove the non-defective semiconductor chip 1A from the defective multilayer circuit board, and then repair the non-defective semiconductor chip 1A to a new non-defective multilayer circuit board. For this purpose, an adsorbing and heating tool is made into contact with an opposite surface of the non-defective semiconductor chip 1A to the surface having the solder bumps 14 and facing to the defective multilayer circuit board. The adsorbing and heating tool has heaters for heating the non-defective semiconductor chip 1A with the solder bumps 14. The adsorbing and heating tool is capable of vacuum adsorption with the non-defective semiconductor chip 1A and also the heaters generate heats to be transmitted through the non-defective semiconductor chip 1A to the solder bumps 14, whereby bonding portions of the solder bumps 14 to electrode pads of the defective multilayer circuit board are melt. In this state, the adsorbing and heating tool performing the vacuum adsorption with the non-defective semiconductor chip 1A is moved upwardly to remove the non-defective semiconductor chip 1A from the defective multilayer circuit board. The non-defective semiconductor chip 1A is peeled from the defective multilayer circuit board for subsequent repairing the non-defective semiconductor chip 1A to a new non-defective multilayer circuit board. The non-defective semiconductor chip 1A is peeled from the defective multilayer circuit board by the mechanical force due to the vacuum adsorption after the solder bumps 14 have sufficiently be heated by the heat conduction from the heaters through the non-defective semiconductor chip 1A. In accordance with the present invention, however, the insulating resin coating layer 4 is provided over passivation film 3, wherein the insulating resin coating layer 4 serves as a stress-buffer layer. Further, the external terminal land portions 10 of the re-wiring layer 9 are provided over the insulating resin coating layer 4. The post electrodes 13 are provided over the external terminal land portions 10 of the re-wiring layer 9, and the solder bumps 14 are provided on the post electrodes 13. The heat and the mechanical force applied by the adsorbing and heating tool result in thermal and mechanical stresses appearing on the solder bumps 14. The insulating resin coating layer 4 isolates and protects the passivation film 3 and the active regions of the semiconductor substrate under the passivation film from the thermal and mechanical stresses. Namely, the insulating resin coating layer 4 isolates and protects the semiconductor chip from the thermal and mechanical stresses.

The insulating sheet 11 is provided over the re-wiring layer 9 having the external terminal land portions 10 and also over the pad electrodes 2, so that the insulating sheet 11 serves as a protecting layer for protecting the re-wiring layer 9 having the external terminal land portions 10 and the pad electrodes 2. The insulating sheet 11 is indirectly contact with the re-wiring layer 9 having the external terminal land portions 10. The adhesive layer 12 is interposed between the insulating sheet 11 and the re-wiring layer 9 having the external terminal land portions 10. Namely, the adhesive layer 12 is interposed between the insulating sheet 11 and the insulating resin coating layer 4. The provision of the adhesive layer 12 between the insulating sheet 11 and the insulating resin coating layer 4 results in that the temperature history causes no thermal stress between the insulating sheet 11 and the insulating resin coating layer 4. No thermal stress between the insulating sheet 11 and the insulating resin coating layer 4 causes no bending of the semiconductor chip or the semiconductor wafer nor crack in the insulating sheet 11.

Fourth Embodiment

Figure 8:
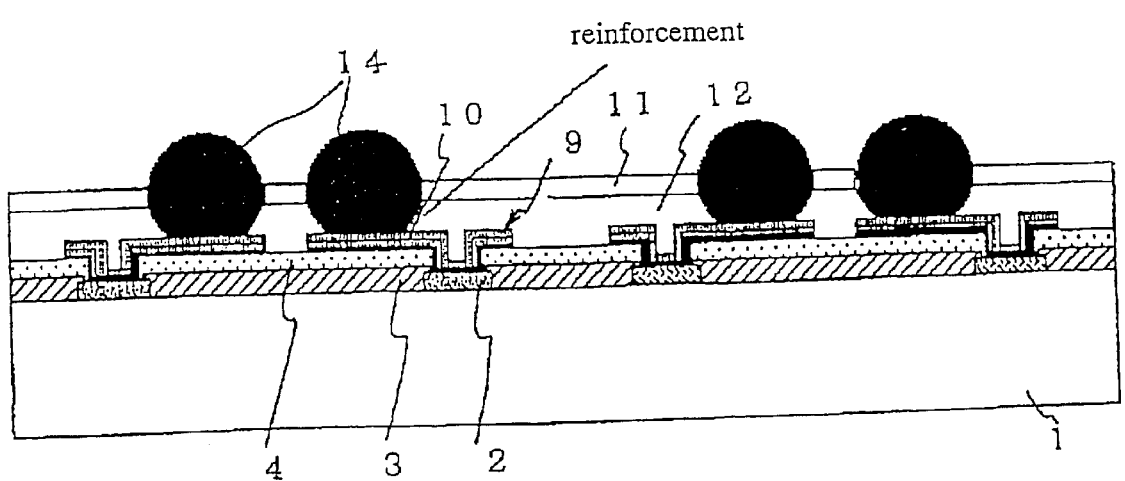
FIG. 8 is a fragmentary cross sectional elevation view illustrative of a fourth novel repairable flip-chip semiconductor device with solder bumps in a fourth embodiment in accordance with the present invention.

A fourth embodiment according to the present invention will be described in detail with reference to the drawings. FIG. 8 is a fragmentary cross sectional elevation view illustrative of a fourth novel repairable flip-chip semiconductor device with solder bumps in a fourth embodiment in accordance with the present invention. Pad electrodes 2 are selectively provided on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further provided on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin. An insulating resin coating layer 4 is entirely provided which extends over the pad electrodes 2 and the passivation film 3. The insulating resin coating layer 4 may comprise an organic material such as a polyimide resin, wherein openings 4a are provided in the insulating resin coating layer 4. The openings 4a are positioned over the pad electrodes 2, so that the pad electrodes 2 are shown through the openings 4a. A pad electrode adhesive metal layer 6 serving as a base metal thin layer is selectively provided, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. A plated-feeding metal layer 7 is also selectively provided on the surface of the pad electrode adhesive metal layer 6. The plated-feeding metal layer 7 has a low electric resistance characteristic for post-serving as a plated-feeding layer. The plated-feeding metal layer 7 may comprise a metal layer such as a copper layer. A re-wiring layer 9 is selectively provided on the plated-feeding metal layer 7, wherein a part of the re-wiring layer 9 serves as an external terminal formation land portion 10.

An insulating sheet 11 is provided over the semiconductor wafer 1 via an adhesive layer 12. The insulating sheet 11 is thinner than in the foregoing embodiments. The adhesive layer 12 extends over the re-wiring layer 9, and the insulating resin coating layer 4. Spherical solder bumps 14 are provided so that the bottoms of the spherical solder bumps 14 are in contact with the external terminal land portions 10 of the re-wiring layer 9. The spherical solder bumps 14 are supported with the adhesive layer 12, and the spherical solder bumps 14 are secured to the external terminal land portions 10 of the re-wiring layer 9. The adhesive layer 12 also serves as a reinforcement layer for reinforcing the bonding of the spherical solder bumps 14 to the external terminal land portions 10 of the re-wiring layer 9.

Figure 9A:
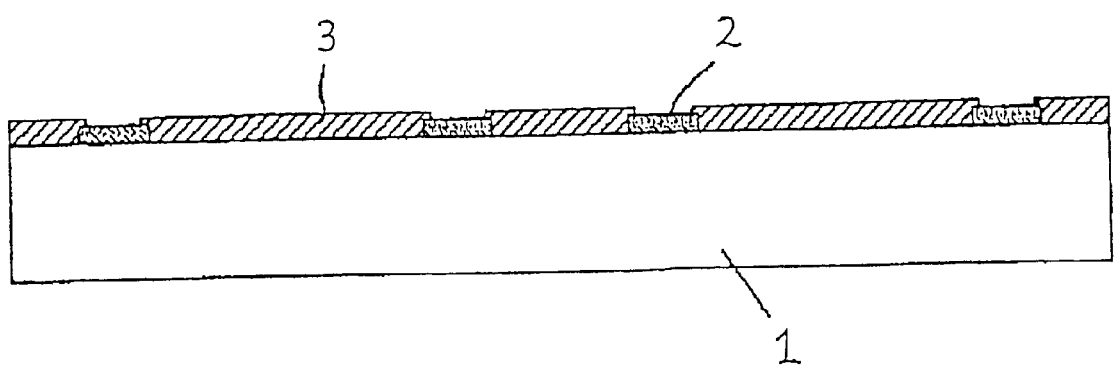
FIGS. 9A through 9N are fragmentary cross sectional elevation views illustrative of fourth novel repairable flip-chip semiconductor devices with solder bumps in sequential steps involved in a fourth novel fabrication method in a fourth embodiment in accordance with the present invention.
Figure 9B:
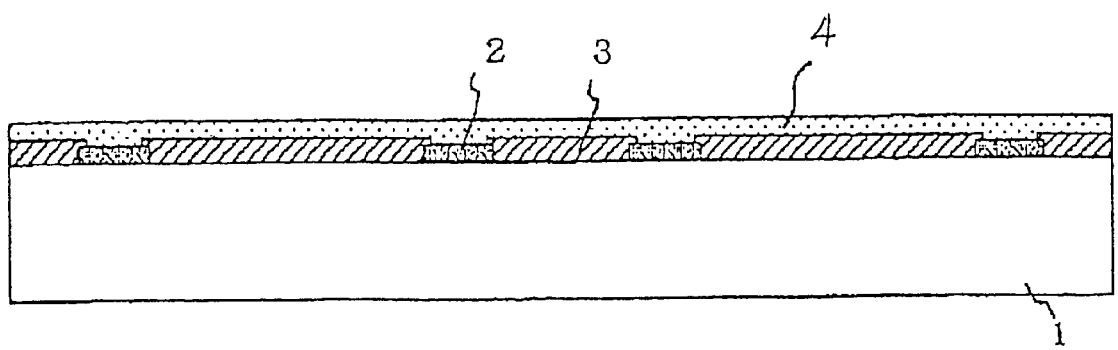
Figure 9C:
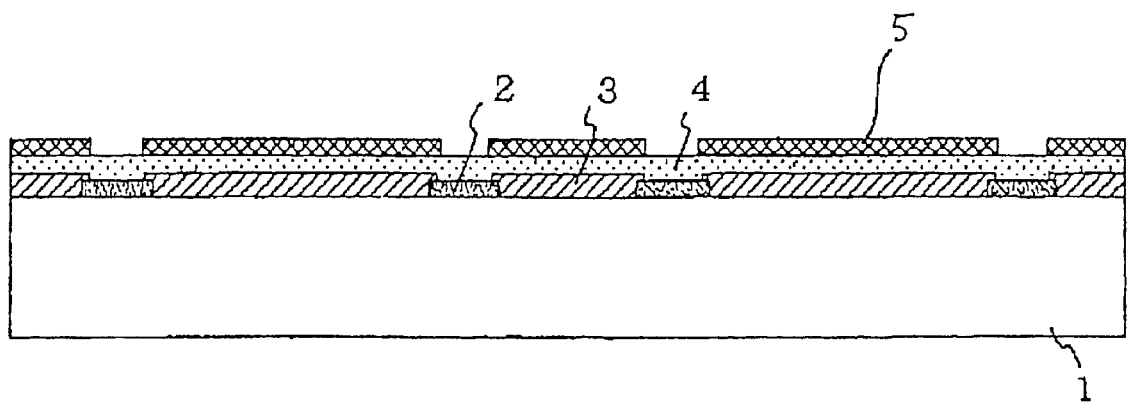
Figure 9D:
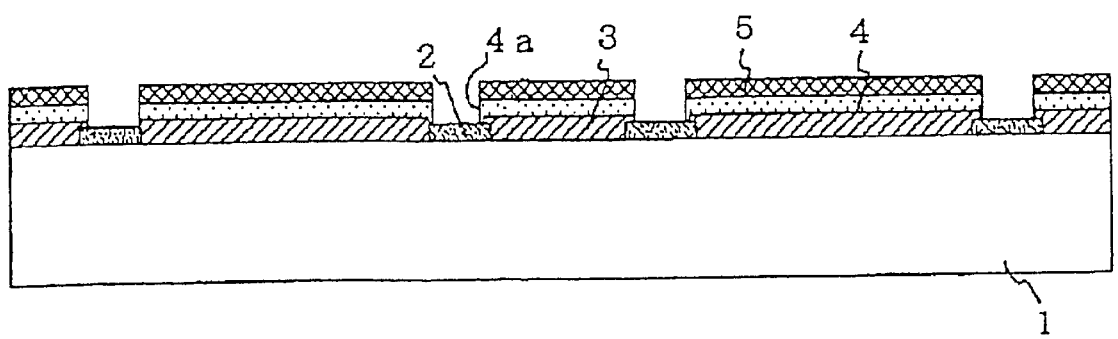
Figure 9E:
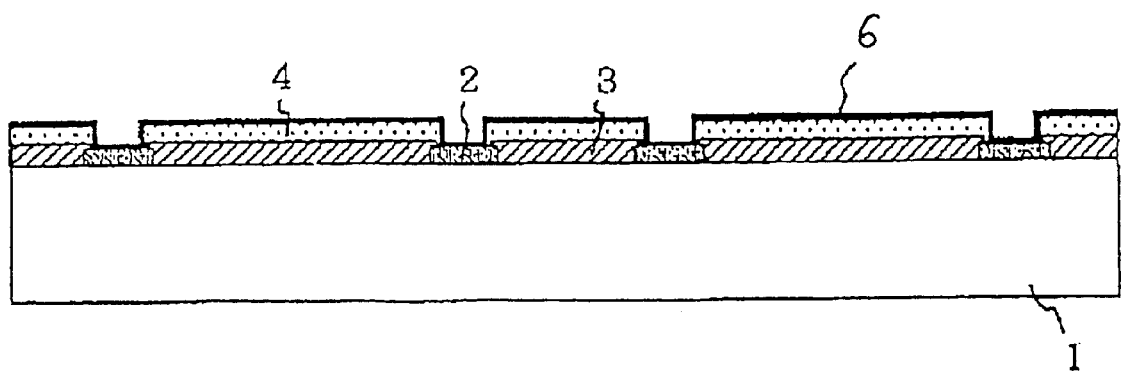
Figure 9F:
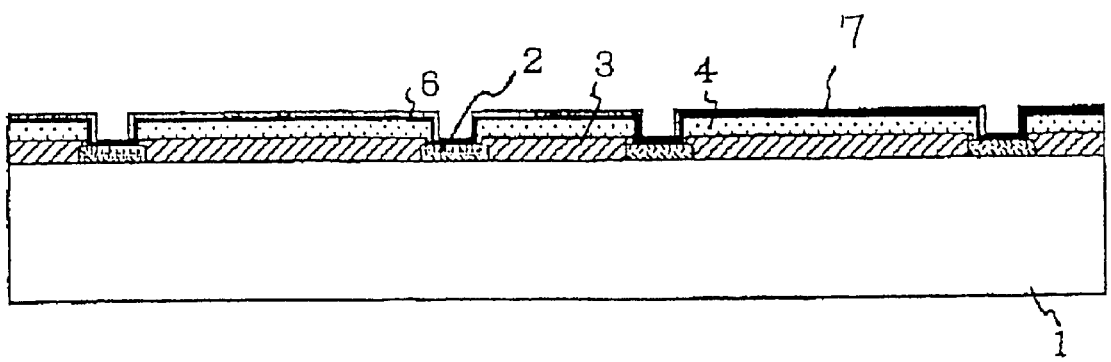
Figure 9G:
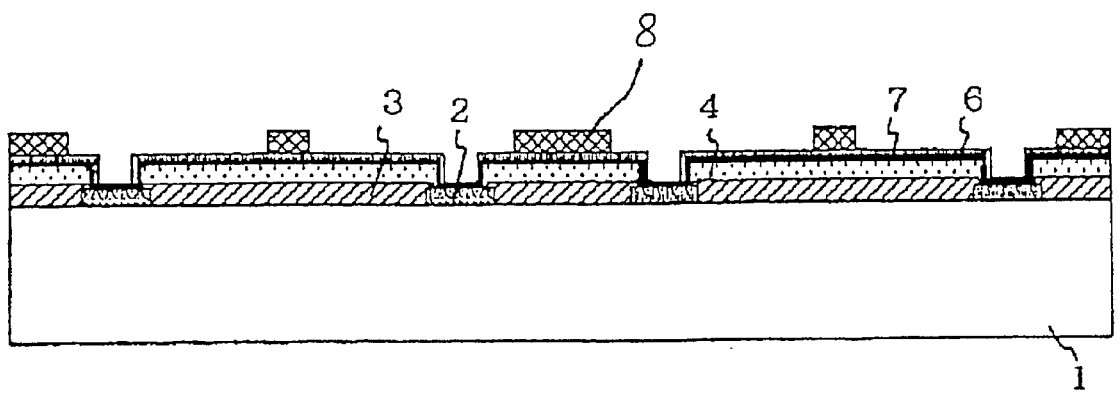
Figure 9H:
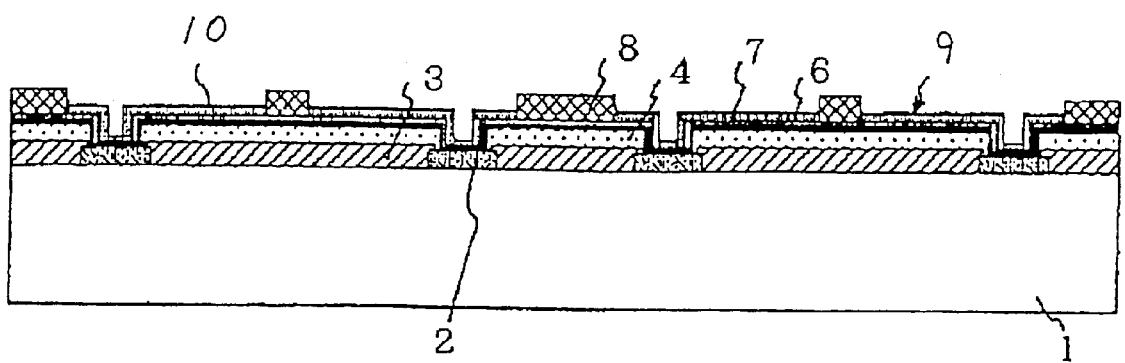
Figure 9I:
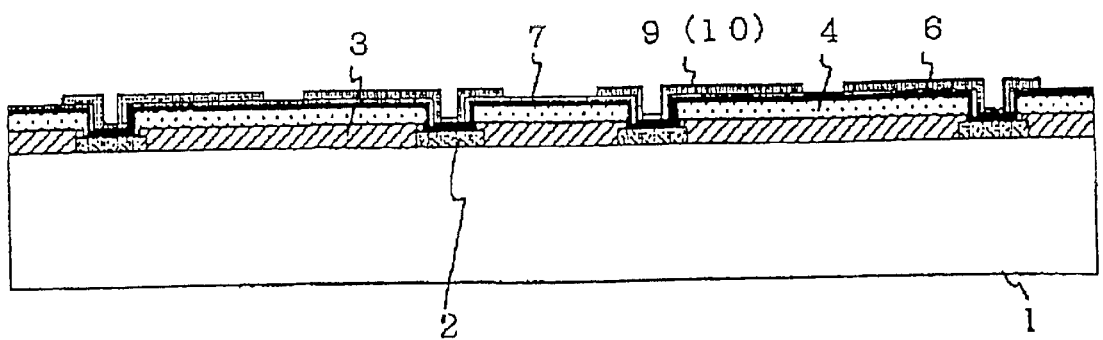
Figure 9J:
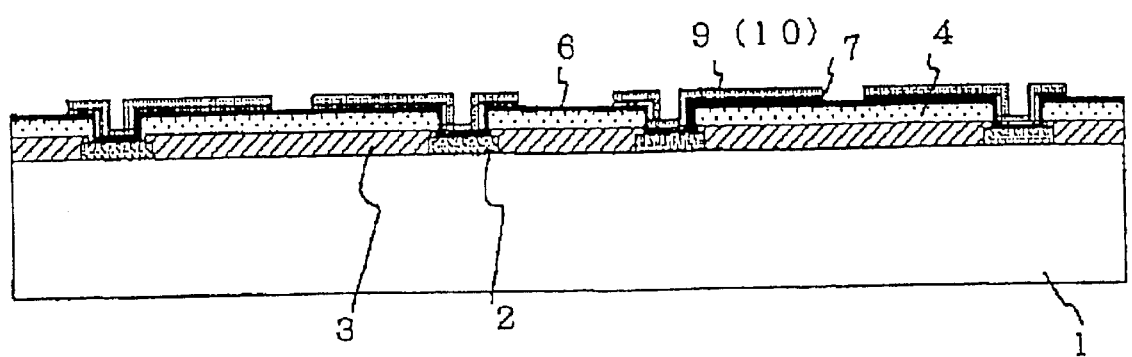
Figure 9K:
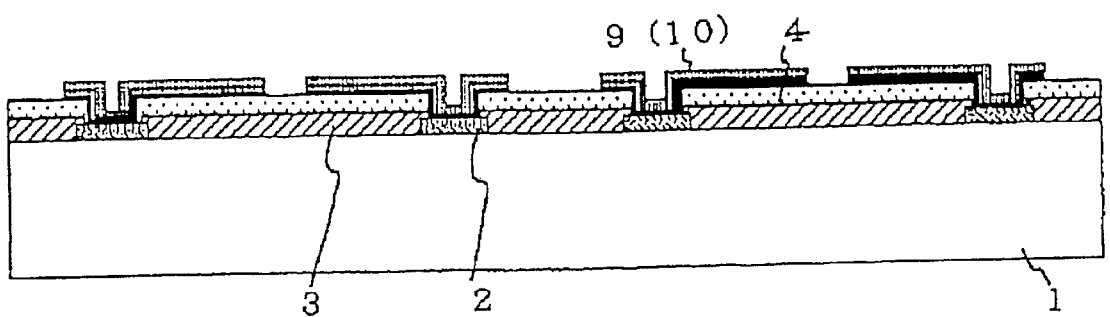
Figure 9L:
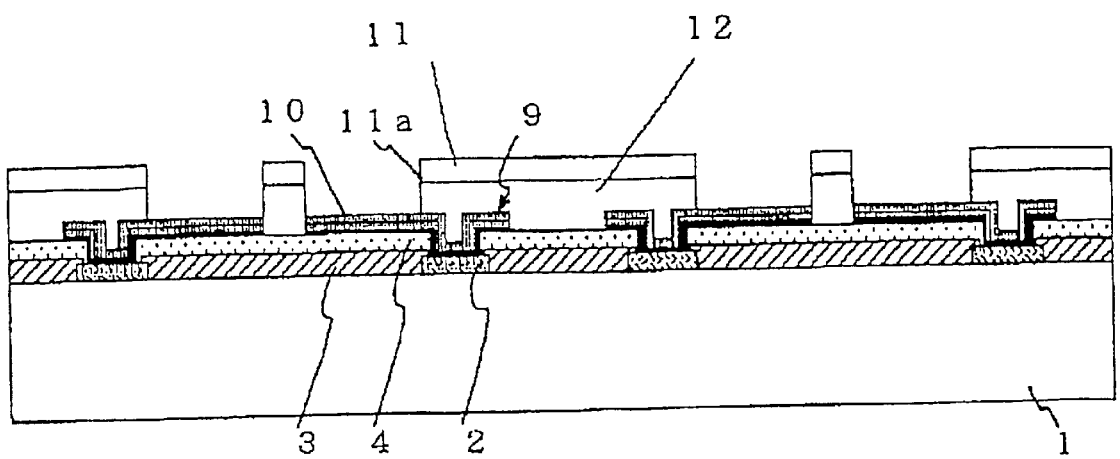
Figure 9M:
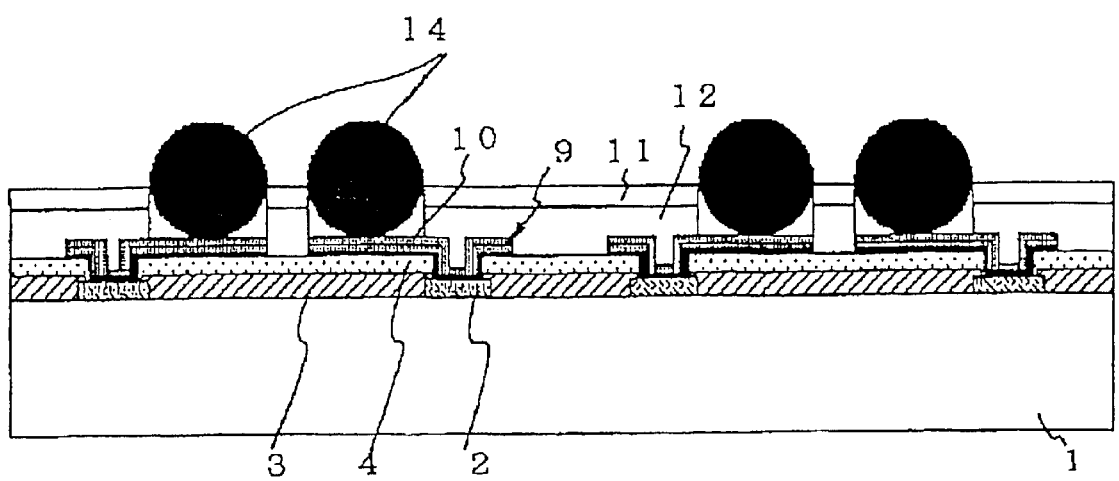
Figure 9N:
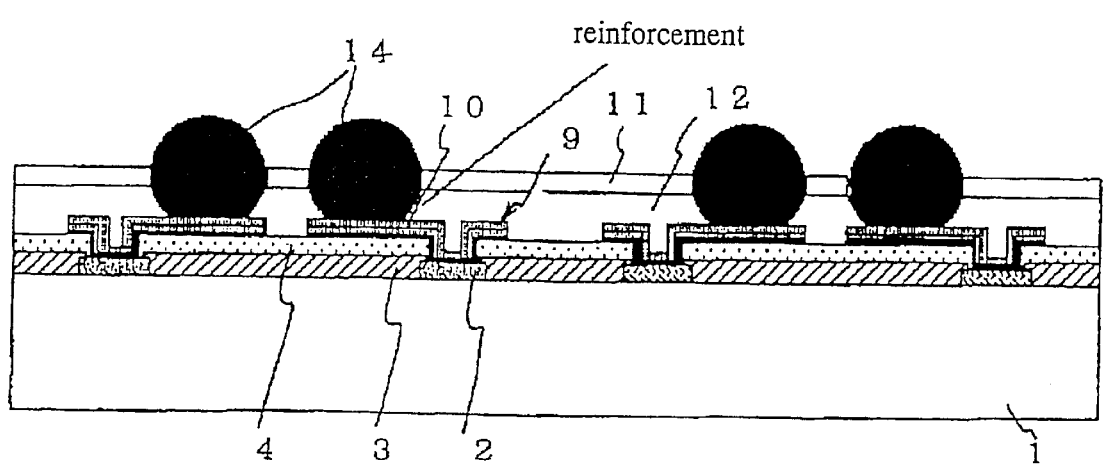

FIGS. 9A through 9N are fragmentary cross sectional elevation views illustrative of fourth novel repairable flip-chip semiconductor devices with solder bumps in sequential steps involved in a fourth novel fabrication method in a fourth embodiment in accordance with the present invention.

With reference to FIG. 9A, pad electrodes 2 are selectively formed on a top surface of a semiconductor wafer 1. The pad electrodes 2 serve as external electrodes. The pad electrodes 2 may comprise a metal such as Al or Cu. The semiconductor wafer 1 has a matrix array of plural chip regions. The pad electrodes 2 are positioned in a peripheral region of each of the chip regions of the semiconductor wafer 1. A passivation film 3 is further formed on the top surface of the semiconductor wafer 1, wherein the passivation film 3 extends over active regions of the plural chip regions of the semiconductor wafer 1 and also around the pad electrodes 2 on the semiconductor wafer 1. The passivation film 3 may comprise an inorganic material such as SiO2 or an organic material such as a polyimide resin.

With reference to FIG. 9B, an insulating resin coating layer 4 is entirely formed which extends over the pad electrodes 2 and the passivation film 3. The insulating resin coating layer 4 may comprise an organic material such as a polyimide resin, wherein the insulating resin for the insulating resin coating layer 4 has a thermal decomposition temperature of not less than 200° C. It is possible that the insulating resin for the insulating resin coating layer 4 is blended with a thermosetting resin material. In this case, a heat treatment is carried out at such a temperature as to cause a crosslinking reaction of the resin components or obtaining desired properties of the insulating resin coating layer 4.

With reference to FIG. 9C, a photo-resist film is entirely applied on a top surface of the insulating resin coating layer 4. The photo-resist film is then subjected to an exposure and subsequent development to form a photo-resist pattern 5 over the top surface of the insulating resin coating layer 4.

With reference to FIG. 9D, the photo-resist pattern 5 is used as a mask to carry out an anisotropic etching to the insulating resin coating layer 4, whereby openings 4a are formed in the insulating resin coating layer 4. The openings 4a are positioned over the pad electrodes 2, so that the pad electrodes 2 are shown through the openings 4a. The used photo-resist pattern 5 is then removed. It is alternatively possible that the insulating resin coating layer 4 may comprise a photosensitive resin material. In this case, it is unnecessary to form the photo-resist pattern, and it is possible that the photosensitive resin coating layer is subjected to an exposure and a subsequent development for patterning the photosensitive resin coating layer, whereby the openings 4a are formed in the photosensitive resin coating layer 4 and positioned over the pad electrodes 2, so that the pad electrodes 2 are shown through the openings 4a.

With reference to FIG. 9E, a pad electrode adhesive metal layer 6 serving as a base metal thin layer is entirely deposited by a sputtering method, so that the pad electrode adhesive metal layer 6 extends over the top surface of the insulating resin coating layer 4, and on side walls of the openings 4a and the top surfaces of the pad electrodes 2. The pad electrode adhesive metal layer 6 may comprise a metal material which has a good adhesiveness with and a gentle metal inter-diffusion with the pad electrodes 2, and also which has a high adhesiveness with the insulating resin coating layer 4. For example, titanium-based alloys or chromium may be available for the pad electrode adhesive metal layer 6. It may optionally be possible that, prior to the formation of the pad electrode adhesive metal layer 6, the surfaces of the pad electrodes 2 are subjected to a plasma surface treatment for cleaning the surfaces of the pad electrodes 2 and also for improving the activity of the surfaces of the pad electrodes 2, so that the pad electrode adhesive metal layer 6 is deposited on the highly clean and highly activated surfaces of the pad electrodes 2.

With reference to FIG. 9F, a plated-feeding metal layer 7 is also entirely deposited by a sputtering method on the surface of the pad electrode adhesive metal layer 6. The plated-feeding metal layer 7 has a low electric resistance characteristic for post-serving as a plated-feeding layer when a re-wiring layer is later formed over the pad electrode adhesive metal layer 6. The plated-feeding metal layer 7 may comprise a metal layer such as a copper layer.

With reference to FIG. 9G, a photo-resist film is entirely applied on the plated-feeding metal layer 7. The photo-resist film is then subjected to an exposure and a subsequent development for patterning the photo-resist film, thereby forming a photo-resist pattern 8, wherein the plated-feeding metal layer 7 is shown and exposed in predetermined re-wiring pattern regions.

With reference to FIG. 9H, a re-wiring layer 9 is formed on the exposed surfaces of the plated-feeding metal layer 7 by a selective electroplating process of copper using the photo-resist pattern 8 as a mask, wherein a part of the re-wiring layer 9 serves as an external terminal formation land portion 10.

With reference to FIG. 9I, the used photo-resist pattern 8 is removed, whereby the re-wiring layer 9 and the plated-feeding metal layer 7 are shown.

With reference to FIG. 9J, a selective wet etching process is carried out by using the re-wiring layer 9 as a mask for selectively etch the plated-feeding metal layer 7, whereby the pad electrode adhesive metal layer 6 are partially shown.

With reference to FIG. 9K, the pad electrode adhesive metal layer 6 is also subjected to the continuous selective wet etching process by using the re-wiring layer 9 as a mask for further selectively etch the pad electrode adhesive metal layer 6, whereby the insulating resin coating layer 4 is partially shown, resulting in that re-wiring patterns, each of which is electrically floated, are thus formed.

With reference to FIG. 9L, an insulating sheet 11 is formed over the semiconductor wafer 1 via an adhesive layer 12, wherein the insulating sheet 11 and the adhesive layer 12 have through holes 11a having the same pattern as the external terminal land portions 10 of the re-wiring layer 9. The insulating sheet 11 is thinner than in the foregoing embodiments, while the through holes 11a have larger diameters than in the foregoing embodiments. The adhesive layer 12 extends over the re-wiring layer 9, and the insulating resin coating layer 4, while the through holes 11a are positioned over the external terminal land portions 10 of the re-wiring layer 9. The through holes 11a are aligned to the external terminal land portions 10 of the re-wiring layer 9, so that the external terminal land portions 10 of the re-wiring layer 9 are shown through the through holes 11a. The alignment of the insulating sheet 11 may easily be carried out by putting an alignment mark on the insulating sheet 11 for alignment of the alignment mark on the insulating sheet 11 to a predetermined position of the semiconductor wafer 1.

With reference to FIG. 9M, spherical solder bumps 14 are placed into the through holes 11a, wherein the bottoms of the spherical solder bumps 14 are in contact with the external terminal land portions 10 of the re-wiring layer 9, wherein inner gaps are formed between inner walls of the through holes 11a and the spherical solder bumps 14.

With reference to FIG. 9N, a heat treatment as a re-flow process is carried out by heating the semiconductor wafer 1 to cause a re-flow of the adhesive layer 12 to fill the inner gaps with the adhesive layer 12, whereby the spherical solder bumps 14 are supported with the adhesive layer 12, and the spherical solder bumps 14 are secured to the external terminal land portions 10 of the re-wiring layer 9. The semiconductor wafer 1 is divided by a dicing blade into plural semiconductor chips 1A, whereby plural flip-chip semiconductor devices are formed.

A non-defective semiconductor chip 1A with the solder bumps 14 as formed in the above described method are then flip-chip-mounted on a multilayer circuit board, wherein the solder bumps 14 are made into contact with pad electrodes of the multilayer circuit board. If the multilayer circuit board is defective, it is necessary to remove the non-defective semiconductor chip 1A from the defective multilayer circuit board, and then repair the non-defective semiconductor chip 1A to a new non-defective multilayer circuit board. For this purpose, an adsorbing and heating tool is made into contact with an opposite surface of the non-defective semiconductor chip 1A to the surface having the solder bumps 14 and facing to the defective multilayer circuit board. The adsorbing and heating tool has heaters for heating the non-defective semiconductor chip 1A with the solder bumps 14. The adsorbing and heating tool is capable of vacuum adsorption with the non-defective semiconductor chip 1A and also the heaters generate heats to be transmitted through the non-defective semiconductor chip 1A to the solder bumps 14, whereby bonding portions of the solder bumps 14 to electrode pads of the defective multilayer circuit board are melt. In this state, the adsorbing and heating tool performing the vacuum adsorption with the non-defective semiconductor chip 1A is moved upwardly to remove the non-defective semiconductor chip 1A from the defective multilayer circuit board. The non-defective semiconductor chip 1A is peeled from the defective multilayer circuit board for subsequent repairing the non-defective semiconductor chip 1A to a new non-defective multilayer circuit board. The non-defective semiconductor chip 1A is peeled from the defective multilayer circuit board by the mechanical force due to the vacuum adsorption after the solder bumps 14 have sufficiently be heated by the heat conduction from the heaters through the non-defective semiconductor chip 1A. In accordance with the present invention, however, the insulating resin coating layer 4 is provided over passivation film 3, wherein the insulating resin coating layer 4 serves as a stress-buffer layer. Further, the external terminal land portions 10 of the re-wiring layer 9 are provided over the insulating resin coating layer 4. The post electrodes 13 are provided over the external terminal land portions 10 of the re-wiring layer 9, and the solder bumps 14 are provided on the post electrodes 13. The heat and the mechanical force applied by the adsorbing and heating tool result in thermal and mechanical stresses appearing on the solder bumps 14. The insulating resin coating layer 4 isolates and protects the passivation film 3 and the active regions of the semiconductor substrate under the passivation film from the thermal and mechanical stresses. Namely, the insulating resin coating layer 4 isolates and protects the semiconductor chip from the thermal and mechanical stresses.

The insulating sheet 11 is provided over the re-wiring layer 9 having the external terminal land portions 10 and also over the pad electrodes 2, so that the insulating sheet 11 serves as a protecting layer for protecting the re-wiring layer 9 having the external terminal land portions 10 and the pad electrodes 2. The insulating sheet 11 is indirectly contact with the re-wiring layer 9 having the external terminal land portions 10. The adhesive layer 12 is interposed between the insulating sheet 11 and the re-wiring layer 9 having the external terminal land portions 10. Namely, the adhesive layer 12 is interposed between the insulating sheet 11 and the insulating resin coating layer 4. The provision of the adhesive layer 12 between the insulating sheet 11 and the insulating resin coating layer 4 results in that the temperature history causes no thermal stress between the insulating sheet 11 and the insulating resin coating layer 4. No thermal stress between the insulating sheet 11 and the insulating resin coating layer 4 causes no bending of the semiconductor chip or the semiconductor wafer nor crack in the insulating sheet 11.

Furthermore, the insulating sheet 11 and the adhesive layer 12 have the through holes 11a which correspond in position to the external terminal land portions 10 of the re-wiring layer 9. For this reason, it is unnecessary to carry out any process for forming openings or through holes in the insulating sheet 11 and the adhesive layer 12 after the insulating sheet 11 and the adhesive layer 12 have been formed over the semiconductor wafer 1. This means the reduction in the number of the necessary manufacturing processes, whereby it is possible to reduce the manufacturing cost. Since the through holes 11a have already been formed in the insulating sheet 11 before the insulating sheet 11 with the through holes 11a are formed over the semiconductor wafer 1, then it is possible to use a laser for forming the through holes 11a in the insulating sheet 11. The laser method is able to form the through holes 11a so that the cross sectional elevation shape of the through holes 11a is tapered, which fits to the spherical shape solder bumps 14.

Further, in this embodiment, the spherical solder bumps 14 are supported with the adhesive layer 12, and the spherical solder bumps 14 are secured to the external terminal land portions 10 of the re-wiring layer 9. The adhesive layer 12 also serves as a reinforcement layer for reinforcing the bonding of the spherical solder bumps 14 to the external terminal land portions 10 of the re-wiring layer 9.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A semiconductor device comprising:
   a semiconductor substrate;
   at least a pad electrode provided over said semiconductor substrate;
   a passivation film provided over said semiconductor substrate;
   an insulative resin stress buffer layer provided over said at least pad electrode and said passivation film, said insulative resin stress buffer layer having at least an opening positioned over at least a part of said at least pad electrode; and
   at least a land portion provided over said insulative resin stress buffer layer and also electrically connected to said at least pad electrode, and a top surface of said at least land portion being electrically connected to at least a bump which is positioned over said at least land portion,
   wherein said at least land portion and said passivation film are isolated from each other by said insulative resin stress buffer layer.

2. The semiconductor device as claimed in claim 1, further comprising:
   an adhesive layer provided over said land portion and said insulative resin stress buffer layer;
   an insulating sheet provided over said adhesive layer;
   at least a through hole penetrating said insulating sheet and said adhesive layer, and said at least through hole being positioned over said at least land portion;
   at least a post electrode in said at least through hole, said at least post electrode having a bottom portion in contact with said top surface of said at least land portion and a top portion in contact with said at least bump, so that said at least land portion is electrically connected through said at least post electrode to said bump.

3. The semiconductor device as claimed in claim 2, further comprising:
   an adhesive metal layer interposed between said at least pad electrode and said at least land portion.

4. The semiconductor device as claimed in claim 3, wherein said adhesive metal layer comprises a metal having a high adhesiveness with said at least pad electrode and a gentle metal inter-diffusion as well as a high adhesiveness with said insulative resin stress buffer layer.

5. The semiconductor device as claimed in claim 1, further comprising:
   an inter-level insulative resin layer provided over said land portion and said insulative resin stress buffer layer;
   at least a first through hole penetrating said inter-level insulative resin layer, and said at least first through hole being positioned over said at least land portion;
   at least a post contact in said at least first through hole, said at least post contact having a bottom portion in contact with said top surface of said at least land portion and a top portion which is equal to or slightly higher in level than a top surface of said inter-level insulative resin layer;
   an adhesive layer provided over said inter-level insulative resin layer;
   an insulating sheet provided over said adhesive layer;
   at least a second through hole penetrating said insulating sheet and said adhesive layer, and said at least second through hole being positioned over said at least post contact; and
   at least a post electrode in said at least through hole, said at least post electrode having a bottom portion in contact with a top of said at least post contact and a top portion in contact with said at least bump, so that said at least land portion is electrically connected through said at least post electrode and said at least post contact to said bump.

6. The semiconductor device as claimed in claim 5, further comprising:
   an adhesive metal layer interposed between said at least pad electrode and said at least land portion.

7. The semiconductor device as claimed in claim 6, wherein said adhesive metal layer comprises a metal having a high adhesiveness with said at least pad electrode and a gentle metal inter-diffusion as well as a high adhesiveness with said insulative resin stress buffer layer.

8. The semiconductor device as claimed in claim 1, further comprising:
   an adhesive layer provided over said land portion and said insulative resin stress buffer layer; and
   an insulating sheet provided over said adhesive layer,
   wherein said at least bump is partially buried in said adhesive layer and said insulating sheet, and a bottom of said at least bump is in contact directly with said top surface of said land portion, and said bump is tightly supported by said adhesive layer and secured to said land portion.

9. The semiconductor device as claimed in claim 8, further comprising:
   an adhesive metal layer interposed between said at least pad electrode and said at least land portion.

10. The semiconductor device as claimed in claim 9, wherein said adhesive metal layer comprises a metal having a high adhesiveness with said at least pad electrode and a gentle metal inter-diffusion as well as a high adhesiveness with said insulative resin stress buffer layer.

11. The semiconductor device as claimed in claim 1, wherein said adhesive metal layer comprises a titanium-based alloy.

12. The semiconductor device as claimed in claim 1, wherein said adhesive metal layer comprises chromium.

13. The semiconductor device as claimed in claim 1, wherein said at least land portion comprises a part of a re-wiring layer extending over said insulative resin stress buffer layer.

14. The semiconductor device as claimed in claim 1, wherein said insulative resin stress buffer layer comprises an organic resin material having a decomposition temperature of not less than 200° C.

15. The semiconductor device as claimed in claim 1, wherein said insulative resin stress buffer layer includes a thermosetting resin composition.

16. The semiconductor device as claimed in claim 1, wherein said insulative resin stress buffer layer comprises a photo-sensitive resin composition.

17. The semiconductor device as claimed in claim 1, wherein said at least bump comprises a spherical solder bump.

18. A semiconductor device comprising:

a semiconductor substrate;

at least a pad electrode provided over said semiconductor substrate;

a passivation film provided over said semiconductor substrate;

an insulative resin stress buffer layer provided over said at least pad electrode and said passivation film, said insulative resin stress buffer layer having at least an opening positioned over at least a part of said at least pad electrode;

at least a land portion provided over said insulative resin stress buffer layer and also electrically connected to said at least pad electrode, and a top surface of said at least land portion being electrically connected to at least a bump which is positioned over said at least land portion;

an adhesive layer provided over said land portion and said insulative resin stress buffer layer;

an insulating sheet provided over said adhesive layer;

at least a through hole penetrating said insulating sheet and said adhesive layer, and said at least through hole being positioned over said at least land portion; and at least a post electrode in said at least through hole, said at least post electrode having a bottom portion in contact with said top surface of said at least land portion and a top portion in contact with said at least bump, so that said at least land portion is electrically connected through said at least post electrode to said bump, wherein said at least land portion and said passivation film are isolated from each other by said insulative resin stress buffer layer.

19. The semiconductor device as claimed in claim 18, further comprising:

an adhesive metal layer interposed between said at least pad electrode and said at least land portion.

20. The semiconductor device as claimed in claim 19, wherein said adhesive metal layer comprises a metal having a high adhesiveness with said at least pad electrode and a gentle metal inter-diffusion as well as a high adhesiveness with said insulative resin stress buffer layer.

21. The semiconductor device as claimed in claim 18, wherein said adhesive metal layer comprises a titanium-based alloy.

22. The semiconductor device as claimed in claim 18, wherein said adhesive metal layer comprises chromium.

23. The semiconductor device as claimed in claim 18, wherein said at least land portion comprises a part of a re-wiring layer extending over said insulative resin stress buffer layer.

24. The semiconductor device as claimed in claim 18, wherein said insulative resin stress buffer layer comprises an organic resin material having a decomposition temperature of not less than 200° C.

25. The semiconductor device as claimed in claim 18, wherein said insulative resin stress buffer layer includes a thermosetting resin composition.

26. The semiconductor device as claimed in claim 18, wherein said insulative resin stress buffer layer comprises a photo-sensitive resin composition.

27. The semiconductor device as claimed in claim 18, wherein said at least bump comprises a spherical solder bump.

28. A semiconductor device comprising:

a semiconductor substrate;

at least a pad electrode provided over said semiconductor substrate;

a passivation film provided over said semiconductor substrate;

an insulative resin stress buffer layer provided over said at least pad electrode and said passivation film, said insulative resin stress buffer layer having at least an opening positioned over at least a part of said at least pad electrode;

at least a land portion provided over said insulative resin stress buffer layer and also electrically connected to said at least pad electrode, and a top surface of said at least land portion being electrically connected to at least a bump which is positioned over said at least land portion;

an inter-level insulative resin layer provided over said land portion and said insulative resin stress buffer layer;

at least a first through hole penetrating said inter-level insulative resin layer, and said at least first through hole being positioned over said at least land portion;

at least a post contact in said at least first through hole, said at least post contact having a bottom portion in contact with said top surface of said at least land portion and a top portion which is equal to or slightly higher in level than a top surface of said inter-level insulative resin layer;

an adhesive layer provided over said inter-level insulative resin layer;

an insulating sheet provided over said adhesive layer;

at least a second through hole penetrating said insulating sheet and said adhesive layer, and said at least second through hole being positioned over said at least post contact; and at least a post electrode in said at least through hole, said at least post electrode having a bottom portion in contact with a top of said at least post contact and a top portion in contact with said at least bump, so that said at least land portion is electrically connected through said at least post electrode and said at least post contact to said bump, wherein said at least land portion and said passivation film are isolated from each other by said insulative resin stress buffer layer.

29. The semiconductor device as claimed in claim 28, further comprising:

an adhesive metal layer interposed between said at least pad electrode and said at least land portion.

30. The semiconductor device as claimed in claim 29, wherein said adhesive metal layer comprises a metal having a high adhesiveness with said at least pad electrode and a gentle metal inter-diffusion as well as a high adhesiveness with said insulative resin stress buffer layer.

31. The semiconductor device as claimed in claim 28, wherein said adhesive metal layer comprises a titanium-based alloy.

32. The semiconductor device as claimed in claim 28, wherein said adhesive metal layer comprises chromium.

33. The semiconductor device as claimed in claim 28, wherein said at least land portion comprises a part of a re-wiring layer extending over said insulative resin stress buffer layer.

34. The semiconductor device as claimed in claim 28, wherein said insulative resin stress buffer layer comprises an organic resin material having a decomposition temperature of not less than 200° C.

35. The semiconductor device as claimed in claim 28, wherein said insulative resin stress buffer layer includes a thermosetting resin composition.

36. The semiconductor device as claimed in claim 28, wherein said insulative resin stress buffer layer comprises a photo-sensitive resin composition.

37. The semiconductor device as claimed in claim 28, wherein said at least bump comprises a spherical solder bump.

38. A semiconductor device comprising:
- a semiconductor substrate;
- at least a pad electrode provided over said semiconductor substrate;
- a passivation film provided over said semiconductor substrate;
- an insulative resin stress buffer layer provided over said at least pad electrode and said passivation film, said insulative resin stress buffer layer having at least an opening positioned over at least a part of said at least pad electrode;
- at least a land portion provided over said insulative resin stress buffer layer and also electrically connected to said at least pad electrode, and a top surface of said at least land portion being electrically connected to at least a bump which is positioned over said at least land portion;
- an adhesive layer provided over said land portion and said insulative resin stress buffer layer; and
- an insulating sheet provided over said adhesive layer,
- wherein said at least land portion and said passivation film are isolated from each other by said insulative resin stress buffer layer, and
- wherein said at least bump is partially buried in said adhesive layer and said insulating sheet, and a bottom of said at least bump is in contact directly with said top surface of said land portion, and said bump is tightly supported by said adhesive layer and secured to said land portion.

39. The semiconductor device as claimed in claim 38, further comprising:
- an adhesive metal layer interposed between said at least pad electrode and said at least land portion.

40. The semiconductor device as claimed in claim 39, wherein said adhesive metal layer comprises a metal having a high adhesiveness with said at least pad electrode and a gentle metal inter-diffusion as well as a high adhesiveness with said insulative resin stress buffer layer.

41. The semiconductor device as claimed in claim 38, wherein said adhesive metal layer comprises a titanium-based alloy.

42. The semiconductor device as claimed in claim 38, wherein said adhesive metal layer comprises chromium.

43. The semiconductor device as claimed in claim 38, wherein said at least land portion comprises a part of a re-wiring layer extending over said insulative resin stress buffer layer.

44. The semiconductor device as claimed in claim 38, wherein said insulative resin stress buffer layer comprises an organic resin material having a decomposition temperature of not less than 200° C.

45. The semiconductor device as claimed in claim 38, wherein said insulative resin stress buffer layer includes a thermosetting resin composition.

46. The semiconductor device as claimed in claim 38, wherein said insulative resin stress buffer layer comprises a photo-sensitive resin composition.

47. The semiconductor device as claimed in claim 38, wherein said at least bump comprises a spherical solder bump.

* * * * *